United States Patent
Hwang et al.

(10) Patent No.: US 8,921,726 B2
(45) Date of Patent: Dec. 30, 2014

(54) TOUCH SCREEN AND MANUFACTURING METHOD THEREOF

(75) Inventors: Ji-Young Hwang, Daejeon (KR);
In-Seok Hwang, Daejeon (KR);
Sang-Ki Chun, Daejeon (KR);
Dong-Wook Lee, Daejeon (KR);
Yong-Koo Son, Daejeon (KR);
Min-Choon Park, Daejeon (KR);
Seung-Heon Lee, Daejeon (KR);
Beom-Mo Koo, Daejeon (KR);
Young-Jun Hong, Daejeon (KR);
Ki-Hwan Kim, Daejeon (KR); Su-Jin Kim, Daejeon (KR); Hyeon Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 250 days.

(21) Appl. No.: 13/148,220

(22) PCT Filed: Feb. 8, 2010

(86) PCT No.: PCT/KR2010/000762
§ 371 (c)(1),
(2), (4) Date: Oct. 18, 2011

(87) PCT Pub. No.: WO2010/090487
PCT Pub. Date: Aug. 12, 2010

(65) Prior Publication Data
US 2012/0031746 A1    Feb. 9, 2012

(30) Foreign Application Priority Data

| Feb. 6, 2009 | (KR) | 10-2009-0009750 |
| Jul. 16, 2009 | (KR) | 10-2009-0065103 |
| Jul. 16, 2009 | (KR) | 10-2009-0065106 |
| Dec. 21, 2009 | (KR) | 10-2009-0127756 |

(51) Int. Cl.
*H03K 17/975* (2006.01)
*G06F 3/041* (2006.01)
*G06F 3/045* (2006.01)
*G06F 3/044* (2006.01)

(52) U.S. Cl.
CPC .............. *G06F 3/041* (2013.01); *G06F 3/045* (2013.01); *G06F 2203/04112* (2013.01); *G06F 2203/04103* (2013.01); *G06F 3/044* (2013.01)
USPC ............................................. 200/600; 216/41

(58) Field of Classification Search
USPC ................................ 200/600; 261/41; 216/41
See application file for complete search history.

(56) References Cited

U.S. PATENT DOCUMENTS

| 6,204,520 B1 | 3/2001 | Ha et al. |
| 6,377,138 B1 | 4/2002 | Takagi et al. |

(Continued)

FOREIGN PATENT DOCUMENTS

| CN | 1236505 A | 11/1999 |
| CN | 1381860 A | 11/2002 |

(Continued)

OTHER PUBLICATIONS

Office Action of the U.S. Patent Office in U.S. Appl. No. 13/147,995, dated Oct. 1, 2014.*

(Continued)

*Primary Examiner* — Xuong Chung Trans
(74) *Attorney, Agent, or Firm* — McKenna Long & Aldridge LLP

(57) ABSTRACT

The present invention provides a method of manufacturing a touch screen, comprising the steps of: a) forming a conductive layer on a substrate; b) forming an etching resist pattern on the conductive layer; and c) forming a conductive pattern having a line width smaller than the line width of the etching resist pattern by over-etching the conductive layer by using the etching resist pattern and a touch screen manufactured by the method. According to the present invention, a touch screen comprising a conductive pattern having an ultrafine line width can be economically and efficiently provided.

18 Claims, 23 Drawing Sheets

(56) References Cited

U.S. PATENT DOCUMENTS

| | | | |
|---|---|---|---|
| 7,396,765 B2 | 7/2008 | Lee et al. | |
| 7,537,800 B2 * | 5/2009 | Sasaki et al. | 427/108 |
| 7,932,183 B2 | 4/2011 | Itoh et al. | |
| 2001/0007362 A1 | 7/2001 | Ha et al. | |
| 2003/0017422 A1 | 1/2003 | Yamaguchi | |
| 2003/0026959 A1 | 2/2003 | Furuse et al. | |
| 2003/0052078 A1 | 3/2003 | Sakayori et al. | |
| 2004/0229028 A1 | 11/2004 | Sasaki et al. | |
| 2005/0158639 A1 | 7/2005 | Yamaguchi | |
| 2006/0256095 A1 * | 11/2006 | Bottari et al. | 345/173 |
| 2007/0001979 A1 | 1/2007 | Yoo et al. | |
| 2007/0031140 A1 | 2/2007 | Biernath et al. | |
| 2007/0097278 A1 | 5/2007 | Rho et al. | |
| 2009/0029127 A1 | 1/2009 | Watanabe et al. | |
| 2009/0133922 A1 * | 5/2009 | Okazaki et al. | 174/389 |
| 2010/0053759 A1 | 3/2010 | Inoue et al. | |
| 2010/0206628 A1 | 8/2010 | Matsui et al. | |
| 2010/0244666 A1 | 9/2010 | Tanaka | |

FOREIGN PATENT DOCUMENTS

| | | | |
|---|---|---|---|
| CN | 1622699 A | 6/2005 | |
| CN | 1975517 A | 6/2007 | |
| CN | 101034262 A | 9/2007 | |
| CN | 101189930 A | 5/2008 | |
| EP | 0127794 | 12/1984 | |
| EP | 0127794 A2 | 12/1984 | |
| EP | 2059095 A1 | 5/2009 | |
| JP | 1976-097770 A | 8/1976 | |
| JP | 1980-6833 A | 1/1980 | |
| JP | 1993-054326 A | 3/1993 | |
| JP | 06-204536 A | 7/1994 | |
| JP | 1998-200234 A | 7/1998 | |
| JP | 2000315683 A | 11/2000 | |
| JP | 2000315890 A | 11/2000 | |
| JP | 2001-077098 | 3/2001 | |
| JP | 2003-069188 A | 3/2003 | |
| JP | 2004-221564 A | 8/2004 | |
| JP | 2006344163 | 12/2006 | |
| JP | 2008009921 A | 1/2008 | |
| JP | 2008-084837 | 4/2008 | |
| JP | 2008-84837 A | 4/2008 | |
| JP | 2008083497 A | 4/2008 | |
| JP | 2008134975 A | 6/2008 | |
| JP | 2008-251822 A | 10/2008 | |
| JP | 2009009249 A | 1/2009 | |
| JP | 2009-176198 A | 8/2009 | |
| JP | 2010-079240 A | 4/2010 | |
| KR | 10-1999-0013298 | 2/1999 | |
| KR | 1999-0013298 A | 2/1999 | |
| KR | 100442556 B1 | 7/2004 | |
| KR | 10-2006-0045260 | 5/2006 | |
| KR | 10-2006-0060795 | 6/2006 | |
| KR | 10-2006-0060795 A | 6/2006 | |
| KR | 10-2006-0070333 | 6/2006 | |
| KR | 2006-0070333 A | 6/2006 | |
| KR | 10-2007-0002801 A | 1/2007 | |
| KR | 2007-0002801 A | 1/2007 | |
| KR | 2008-0042111 A | 5/2008 | |
| TW | 493285 B | 7/2002 | |
| TW | 200818981 A | 4/2008 | |
| WO | 2008-029776 A1 | 3/2008 | |
| WO | 2008/029776 A1 | 3/2008 | |

OTHER PUBLICATIONS

Office Action of Chinese Patent Office in Application No. 201080007007.6, dated Apr. 24, 2013.
Office Action of Japanese Patent Office in Application No. 2012-520547, dated Apr. 2, 2013.
Printed Circuits Handbook, Sixth Edition, Clyde F. Coombs, Jr, 2008, McGraw-Hill, ISBN: 978-0-07-146734-6, p. 34.22-34.25.
Office Action of Japanese Patent Office in Application No. 2012-520547, dated Mar. 17, 2014.
Office Action of Chinese Patent Office in Application No. 201080007009.5, dated Feb. 25, 2014.

* cited by examiner

TOUCH SCREEN AND MANUFACTURING METHOD THEREOF

This application is a national stage application of PCT/KR/2010/000762, filed Feb. 8, 2010, which claims priority from Korean Patent Application Nos. 10-2009-0009750, 10-2009-0065103, 10-2009-0065106, and 10-2009-0127756, filed on Feb. 6, 2009, Jul. 16, 2009, Jul. 16, 2009, and Dec. 21, 2009 in the Korean Intellectual Property Office, respectively, all of which are incorporated herein by reference in their entirety.

TECHNICAL FIELD

The present invention relates to a touch screen and a manufacturing method thereof.

BACKGROUND ART

In general, a touch screen is used by patterning an ITO-based conductive layer, but when the ITO is applied to a large-area touch screen, a recognition speed lowers due to self-RC relay. In order to solve the problem, a technology for displacing the ITO by using a printing method has been developed in a lot of corporations, but the technology is difficult to form a fine pattern having high accuracy which is invisible to the naked eye with respect to visibility.

DISCLOSURE

Technical Problem

In order to solve problems in the related art, the present invention provides a manufacturing method capable of economically and efficiently manufacturing a touch screen comprising a conductive pattern having high accuracy and an ultrafine line width and a touch screen manufactured by the method.

Technical Solution

An exemplary embodiment of the present invention provides a method of manufacturing a touch screen, comprising the steps of: a) forming a conductive layer on a substrate; b) forming an etching resist pattern on the conductive layer; and c) forming a first conductive pattern having a line width smaller than the line width of the etching resist pattern by over-etching the conductive layer by using the etching resist pattern.

The method of manufacturing a touch screen according to the present invention may further comprise d1) forming a second conductive pattern in the same manner as steps a) to c), except for forming on the conductive layer on not the substrate but the first conductive pattern, d2) forming a second conductive pattern on the substrate in the same manner as steps a) to c) at an opposite side of a surface formed with the first conductive pattern of the substrate, or d3) laminating a surface of the substrate with a second conductive pattern on a surface of the substrate with the first conductive pattern or a surface with the first conductive pattern after forming the second conductive pattern on an additional substrate in the same manner as steps a) to c).

The method may further comprise e) removing the etching resist pattern; or f) reforming the etching resist pattern so as to cover the conductive pattern, after step c). The method may further comprise forming an insulating layer on the first conductive pattern, when performing step e).

In steps d1) to d3), an additional insulating layer may be formed on the second conductive pattern after forming the second conductive pattern in the same manner as steps a) to c).

Another exemplary embodiment of the present invention provides a touch screen comprising: a substrate; a conductive pattern formed on at least one side of the substrate; and an insulating layer pattern covering the conductive pattern and manufactured by using the method of manufacturing the touch screen.

Another exemplary embodiment of the present invention provides a touch screen comprising: a substrate; a conductive pattern formed on at least one side of the substrate; and an insulating layer pattern covering the conductive pattern, in which a taper angle of the conductive pattern is small. The conductive pattern may have a taper angle of more than 0 to less than 90 degrees, preferably, more than 0 to 45 degrees or less, and more preferably, more than 0 to 30 degrees or less.

Another exemplary embodiment of the present invention provides a touch screen comprising: a substrate; a conductive pattern formed on at least one side of the substrate; and an insulating layer pattern covering the conductive pattern, in which a taper angle of the insulating layer pattern is small. The insulating layer pattern may have a taper angle of more than 0 to less than 90 degrees, preferably, more than 0 to 70 degrees or less, and more preferably, more than 0 to 30 degrees or less.

Another exemplary embodiment of the present invention provides a touch screen comprising: a substrate; a conductive pattern formed on at least one side of the substrate; and an insulating layer pattern covering the conductive pattern, in which a taper angle of the insulating layer pattern is larger than the taper angle of the conductive pattern. The taper angle of the insulating layer pattern is not particularly limited if being larger than that of the conductive pattern, but more preferably larger than that of the conductive pattern by more than 0 degree and 4 degrees or less.

Another exemplary embodiment of the present invention provides a touch screen comprising: a substrate; a conductive pattern formed on at least one side of the substrate; and an insulating layer pattern covering the conductive pattern, in which a void is comprised between the conductive pattern and the insulating layer pattern.

Another exemplary embodiment of the present invention provides a touch screen comprising: a substrate; and a conductive pattern formed on at least one side of the substrate and having a line width of 100 micrometers or less, preferably, 0.1 to 30 micrometers, more preferably, 0.5 to 10 micrometers, and more preferably, 1 to 5 micrometers. The touch screen according to the exemplary embodiment may further comprise an insulating layer pattern covering the conductive pattern on the conductive pattern. The touch screen may further comprise an insulating layer pattern having a pattern corresponding to the conductive pattern and a line width larger than the line width of the conductive pattern.

Another exemplary embodiment of the present invention provides a touch screen comprising: a substrate; a conductive pattern formed on at least one side of the substrate; and an insulating layer pattern covering the conductive pattern or an insulating layer pattern having a pattern corresponding to the conductive pattern and a line width larger than the line width of the conductive pattern, in which in a cross-section of the line width direction of the conductive pattern, a percentage a/b*100 of a distance a from one end of the conductive pattern to the insulating layer pattern and a distance b from the other end of the conductive pattern to the insulating layer pattern is in the range of 90 to 110.

Advantageous Effects

According to exemplary embodiments of the present invention, since a touch screen can comprise a conductive pattern with high precision and an ultrafine line width, the touch screen is excellent in performance and very efficient and economic in manufacturing method thereof. Further, the conductive pattern is in high precision and has the ultrafine line width and in addition, can have a large area.

BEST MODE

Hereinafter, the present invention will be described in more detail.

A method of manufacturing a touch screen according to the present invention comprises the steps of a) forming a conductive layer on a substrate; b) forming an etching resist pattern on the conductive layer; and c) forming a first conductive pattern having a line width smaller than a line width of the etching resist pattern by over-etching the conductive layer by using the etching resist pattern. In this specification, the over-etching is to etch the conductive layer so as to have a line width smaller than a line width of the etching resist pattern.

In the case where the touch screen according to the present invention comprises two or more conductive patterns, the method of manufacturing the touch screen according to the present invention may further comprise any one of the following steps d1) to d3):

d1) forming a second conductive pattern in the same manner as steps a) to c), except for forming on the conductive layer on not the substrate but the first conductive pattern;

d2) forming a second conductive pattern on the substrate in the same manner as steps a) to c) at an opposite side of a surface formed with the first conductive pattern of the substrate; or d3) laminating a surface of the substrate with a second conductive pattern on a surface of the substrate with the first conductive pattern or a surface with the first conductive pattern after forming the second conductive pattern on an additional substrate in the same manner as steps a) to c).

In this specification, a method or a material of forming a conductive pattern to be described below may be applied to the first conductive pattern and the second conductive pattern.

Figure 1:
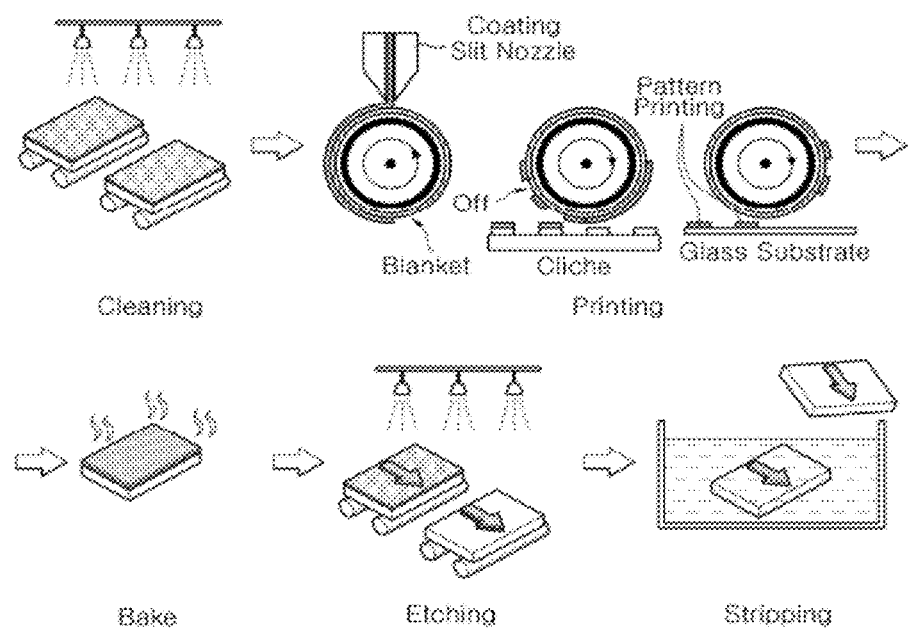
FIGS. 1 to 5 are exemplified diagrams illustrating exemplary embodiments of a method according to the present invention.
Figure 2:
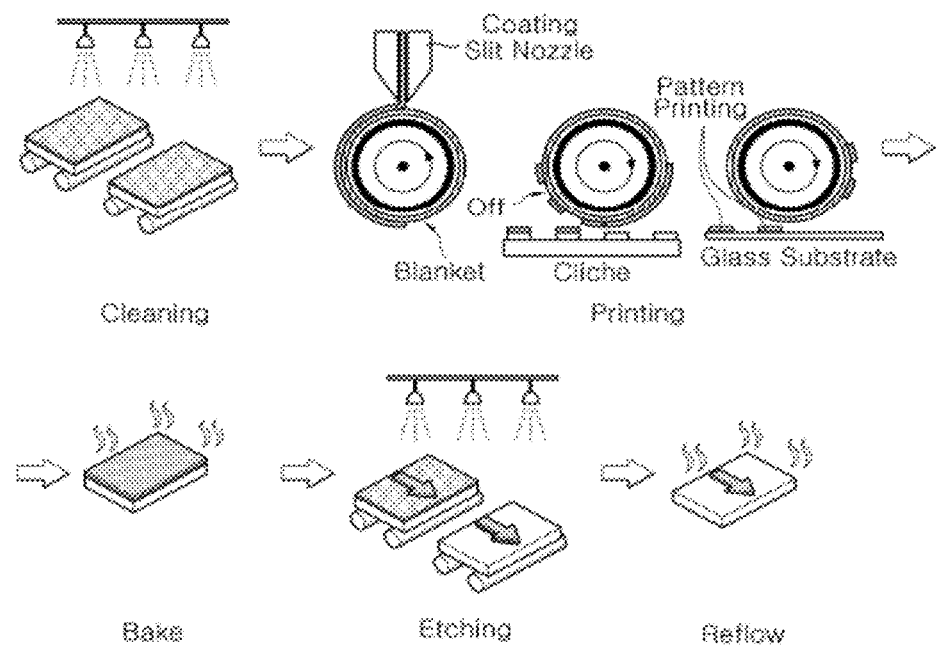
Figure 3:
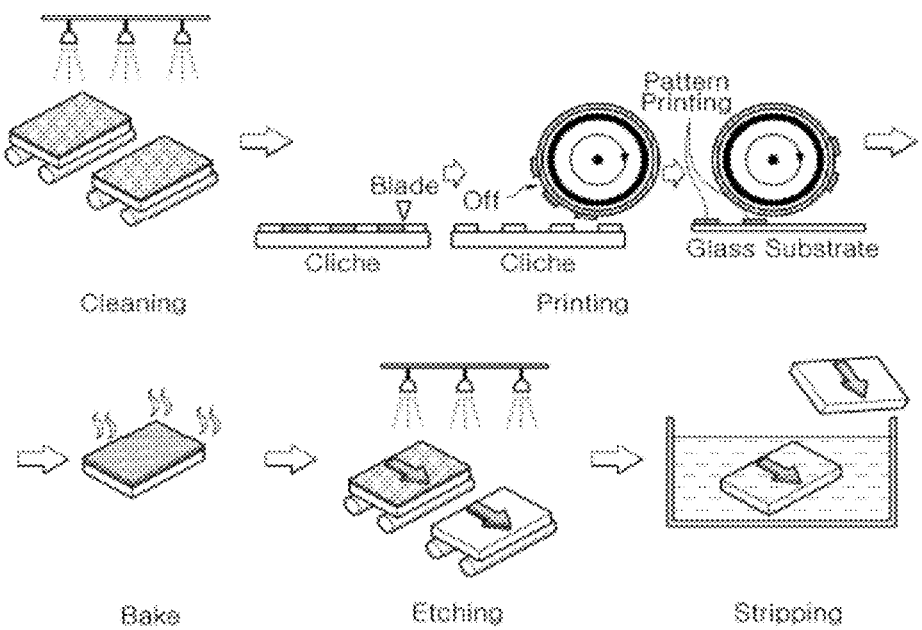
Figure 4:
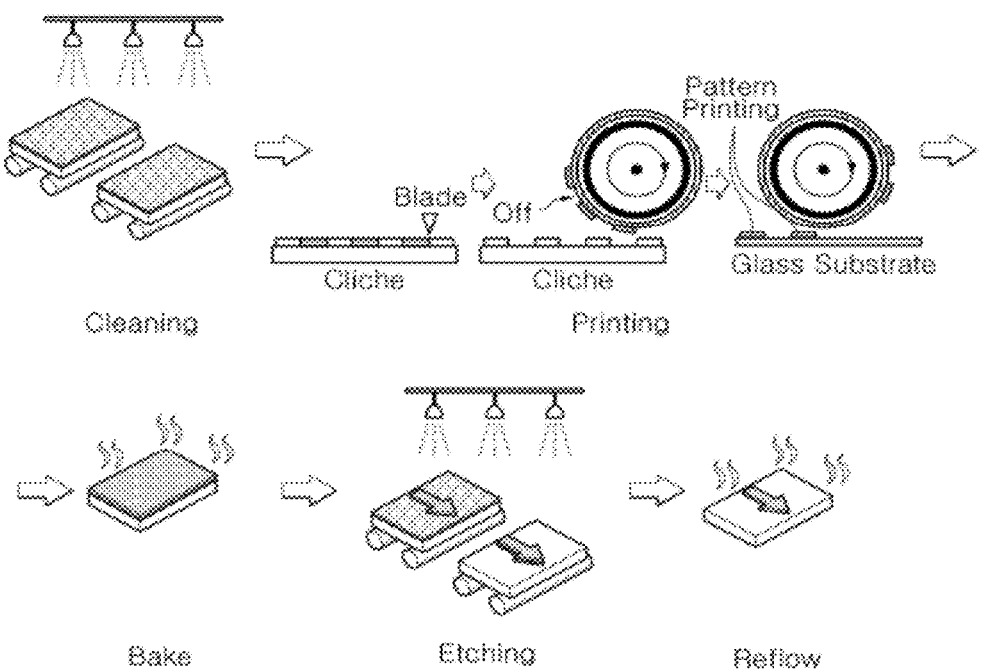

The manufacturing method may further comprise e) removing the etching resist pattern; or f) reforming the etching resist pattern so as to cover the conductive pattern, after step c). In the case of performing step e), the method may further comprise forming an insulating layer on the first conductive pattern. An example using step e) is shown in FIGS. 1 and 3 and an example using step f) is shown in FIGS. 2 and 4, but the scope of the present invention is not limited to the processes shown in the drawings and some processes shown in FIGS. 1 to 4 may be omitted or added, if necessary.

In step d), an additional insulating layer may be formed on the second conductive pattern after forming the second conductive pattern in the same manner as steps a) to c).

In this specification, when the etching resist pattern has an insulating property, the description for the insulating layer pattern may be applied.

The material of the substrate may be properly selected according to a field to intend to apply the method of manufacturing the conductive pattern according to the present invention and a preferable example is a glass or inorganic material substrate, a plastic substrate, or other flexible substrates, but the material of the substrate is not limited thereto.

In addition, the material of the conductive layer is not particularly limited, but may be a metal layer. A particular example of the material of the conductive layer may be a single layer of a multilayer comprising silver, aluminum, copper, neodium, molybdenum or an alloy thereof. Herein, a thickness of the conductive layer is not particularly limited, but may be 0.01 to 10 μm with respect to conductivity of the conductive layer and economical efficiency of a forming process.

The method of forming the conductive layer is not particularly limited, but may use a method such as deposition, sputtering, wet coating, evaporation, electrolytic plating or electroless plating, lamination of a metal foil, or the like. According to the method of the present invention, the conductive pattern comprised in an effective screen part of electronic components for a display and a wire part for applying a signal thereof can be formed at the same time. Particularly, the method of forming the conductive layer may use a method for granting conductivity by firing and/or drying after coating a solution comprising organic metal, nano-metal, or a complex thereof on the substrate. The organic metal may use organic silver and the nano-metal may use nano-silver particles or the like.

In the present invention, the method may further comprise forming a buffer layer for improving adhesivity on the substrate, before forming the conductive layer.

The method according to the present invention may further comprise washing the formed conductive layer after step a).

The inventors of the present invention found that a line edge roughness (LER) of the etch resist pattern formed in step b) determines a critical dimension of a minimum line width of the conductive pattern which can be formed by the over-etching without disconnection. When the line edge roughness (LER) of the etch resist pattern is very large, the conductive pattern may be disconnected before acquiring the conductive pattern having a desired line width in the over-etching. The line edge roughness (LER) of the etching resist pattern may be a half of the minimum line width of the conductive pattern. Accordingly, the line edge roughness (LER) of the etching resist pattern may be controlled by a half of a line width of the desired conductive pattern. Therefore, the line edge roughness (LER) of the etching resist pattern is preferably 0.1 to 5 micrometers, and more preferably, 0.2 to 5 micrometers. In the case of the range, it is advantageous to form the conductive pattern having an ultrafine line width of 10 micrometers or less, and preferably, 5 micrometers or less. Herein, the line edge roughness (LER) means a height of the most protruding point based on the deepest point in the line edge of the etching resist pattern.

In step b), a method of forming the etching resist pattern is preferably a printing method, a photolithography method, a photography method, a method using a mask, or a laser transfer, for example, thermal transfer imaging method and more preferably, the printing method or the photolithography method.

The printing method may be performed by transferring and firing a paste or an ink comprising an etching resist material on the substrate formed with the conductive layer in a desired pattern form. The transferring method is not particularly limited, but may be performed by forming the pattern on a pattern transfer medium such as an intaglio or a screen and transferring the desired pattern on the conductive layer by using the same. The method of forming the pattern form on the pattern transfer medium may use a known method in the art.

The printing method is not particularly limited, but may use a printing method such as a gravure offset printing, a reverse offset printing, a screen printing, a gravure printing and more preferably, the gravure offset printing or the reverse offset printing method in order to acquire the conductive pattern having an ultrafine line width by forming the etching resist pattern within the range of the line edge roughness (LER) described above.

The reverse offset printing method may be performed by forming a desired pattern on a blanket by applying a paste on a roll-type blanket and then, contacting the paste with a cliché having unevenness, and thereafter, transferring the pattern formed on the blanket to the conductive layer. The print method was shown in FIGS. 1 and 2. In addition, the gravure offset printing method may be performed by filling a paste into an intaglio having a pattern, primary transferring the paste with silicon rubber called a blanket, and secondary transferring by contacting the blanket and the substrate formed with the conductive layer. The printing method was shown in FIGS. 3 to 5. However, the method of implementing the present invention is exemplified in FIGS. 1 to 5 and the scope of the present invention is not limited thereto. Some processes shown in FIGS. 1 to 5 may be omitted or added, if necessary.

In the case of the gravure offset printing method or the reverse offset printing method, since the ink or the paste is almost transferred on the substrate with the conductive layer due to releasing property of the blanket, washing for the blanket is not additionally needed. The intaglio may be manufactured by etching precisely the substrate. The intaglio may be manufactured by etching a metal plate or may be manufactured by optical patterning using a polymer resin.

The screen printing method may be performed by positioning a paste on a screen having a pattern and then, directly positioning the paste on the substrate with the conductive layer through the screen having an empty space while pushing a squeeze. The gravure printing method may be performed by winding the blanket having the pattern on a roll, filling the paste into the pattern, and then, transferring the paste on the substrate with the conductive layer. In the present invention, the methods may be singly used and may be complexly used. In addition, other printing methods which are known to a person with ordinary skill in the art may be used.

In the present invention, the printing methods may be used and particularly, the offset printing method, the reverse offset printing method, or the gravure printing method may be used.

In the case of the reverse offset printing method, a viscosity on an ink for printing comprising the material of the etching resist pattern is preferably more than 0 cps to 1000 cps or less and more preferably 5 cps to 10 cps. In addition, in the case of the gravure printing method, a viscosity of the ink is preferably 6,000 cps to 12,000 cps, and more preferably 7,000 cps to 8,000 cps. When the viscosity of the ink is within the range, in each printing method, the coating of the ink can be performed well and stability of the ink in the process (process maintaining capability of the ink) can be maintained.

In the present invention, the method of forming the etching resist pattern is not limited to the printing methods described above and may use the photolithography method. For example, the method may be performed by forming a etching resist layer having photosensitivity and acid resistance (resistance for etching) on the conductive layer and patterning the formed etching resist layer by selective exposure and development.

In the case of reforming the etching resist pattern so as to cover the conductive pattern after etching the conductive layer by using the etching resist pattern as a mask, a taper angle of the etching resist pattern is preferably more than 0 to less than 90 degrees and more preferably 10 or more to 70 degrees or less. When the taper angle of the etching resist pattern is within the range, the etching resist pattern may be easily reformed and the etching resist pattern may sufficiently cover the conductive pattern.

The etching resist pattern is preferably formed by using a material having acid resistance and sufficient adhesion with the conductive layer without reacting with an etchant used in the etching of the conductive layer. In addition, in the case of reforming the etching resist pattern so as to cover the conductive pattern after etching the conductive layer by using the etching resist pattern as a mask, the material of the etching resist pattern may have insulating property. Further, in step f), the material of the etching resist pattern preferably use a polymer material having mobility and acid resistance by processing under a condition used in the reformation of the etching resist pattern, for example, heat, solvent, fume (fume of the solvent), plasma, or the like, and more preferably use a polymer material having a cross-linking property.

The material of the etching resist pattern may have insulation with a leakage current of $10^{-1}$ ampere or less. The leakage current of the material of the etching resist pattern may be $10^{-16}$ ampere or more. The material of the etching resist pattern preferably has acid resistance for the etchant of the conductive layer used in the corresponding method and for example, is preferably a material without a change in a shape for 10 minutes when contacting the etchant of the corresponding conductive layer by an immersing or spraying method.

Figure 5:
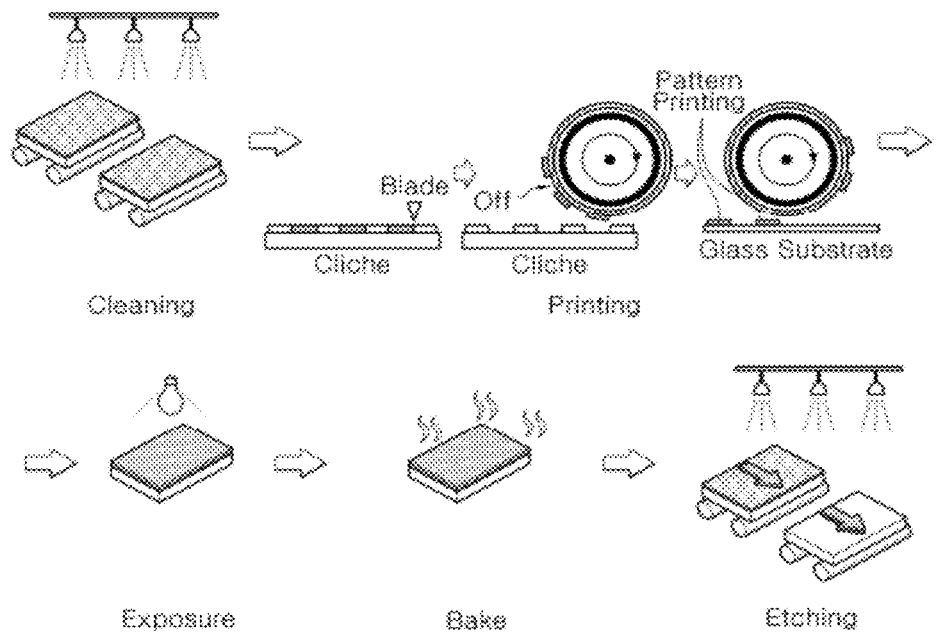

Further, the material of the etching resist pattern preferably has mobility under a processing condition for step f) to be described below. In particular, the material of the etching resist pattern may use a polymer material having plasticity and curability. In the present invention, the material of the etching resist pattern may use a thermosetting resin and a UV curable resin. The UV curable resin may not use a solvent as compared with the thermosetting resin, such that there is no problem due to the evaporation of the solvent and a stable shape of fine pattern is advantageously formed. FIG. 5 exemplifies the case of manufacturing the etching resist pattern by using the UV curable resin.

In detail, the material of the etching resist pattern may use, for example, imide-based polymer, bisphenol-based polymer, epoxy-based polymer, acryl-based polymer, ester-based polymer, novolac-based polymer, or a combination thereof. Among the polymers, the acryl-based, imide-based, or novolac-based polymer resin is preferably used. In addition, the material of the etching resist pattern may use two or more combinations or copolymer of imide-based monomer, bisphenol-based monomer, epoxy-based monomer, acryl-based monomer, and ester-based monomer and for example, copolymer of epoxy and acryl resin or epoxy and acryl monomer may be used.

In the case of the etching resist pattern formed by the printing method, process margin can be increased by controlling a content of solid or properly selecting a solvent.

The content of the solid in an ink composition for forming the etching resist pattern may be differently controlled according to a kind of the printing methods or a thickness of the etching resist pattern. For example, in the case of the gravure offset printing method, the content of the solid of the etching resist pattern composition is preferably 70 to 80 wt %. Further, in the case of forming the etching resist pattern having a thickness of 100 nm to 10 micrometers, and more preferably 500 nm to 2 micrometers by using the reverse offset printing method, the content of the solid of the etching resist pattern composition is preferably 10 to 25 wt %. However, the scope of the present invention is not limited to the examples and the content of the solid of the etching resist pattern composition can be controlled by the person with ordinary skill in the art according to other materials or process conditions.

A solvent that can be added in the etching resist pattern composition may use a solvent used in the art and may use a single kind or two or more kinds of mixed solvent. For example, any solvent which does not cause damage to a blanket material used in the printing method, for example, PDMS is not particularly limited. For example, propylene glycol methyl ether acetate (PGMEA), ethanol, propylene carbonate, butyl cellosolve, dimethyl acetamide (DMAc), methyl ethyl ketone (MEK), methyl isobutyl ketone (MIBK), or the like may be used.

The composition for forming the etching resist pattern may further comprise an adhesion promoter, a surfactant, and the like.

In the case of reforming the etching resist pattern so as to cover the conductive pattern after etching the conductive layer by using the etching resist pattern as a mask, in order to sufficiently cover a conductive wire with the etching resist pattern, a thickness of the etching resist pattern is preferably larger than a thickness of the conductive wire, but is not limited thereto. In addition, a width of the etching resist pattern may be properly selected by the person with ordinary skill in the art according to a field to which the method of the present invention is applied, but is not particularly limited. For example, a lower width of the etching resist pattern preferably has a dimension so as to cover both an upper surface and a side surface of the conductive wire.

In step c), the conductive pattern is formed so as to have a line width smaller than the line width of the etching resist pattern by over-etching by using the etching resist pattern as the mask.

The etching method may be a wet-etching using an etchant or a dry-etching using plasma or a laser, but is not limited thereto.

In the wet-etching, the etchant may be a nitric acid solution, a mixed acid solution of phosphate/nitrate/acetate, one or two or more of a nitric acid ($HNO_3$) solution, a mixed acid solution of phosphoric acid/nitric acid/acetic acid, hydrogen peroxide, perchloric acid, hydrochloric acid, hydrofluoric acid, and oxalic acid, or an aqueous solution thereof may be used as the etching solution, and if necessary, an additive and other elements for etching the desired conductive layer may be added thereto, but the solution is not limited thereto. In general, an etchant known as an etching solution of the corresponding conductive layer may be used.

In step c), when etching the conductive layer, an undercut is formed at the lower portion of an edge of the etching resist pattern by performing the over-etching.

The "undercut" means a shape having an area of a first layer smaller than an area of a second layer by being over-etched at the side of the first layer, when only the first layer is selectively etched by using the second layer as a mask after forming the first layer on the substrate and the second layer thereon. Herein, "by using the second layer as a mask" means that the second layer is not deformed or removed by the etching and is left as it is.

In the general etching process, when the first layer is etched by using the second layer as a mask, a pattern of the first layer is implemented in the same shape as a pattern of the second layer and the formation of the undercut is prevented.

However, in the present invention, the conductive pattern having a line width further thinner than a line width of the etching resist pattern may be acquired by etching the conductive layer so as to form the undercut at the lower portion of the etching resist pattern.

In step c), when the undercut is formed by the over-etching, a line width or a length of the etching resist pattern is larger than a line width or a length of the conductive pattern.

Further, when the undercut is generated, a taper angle of the conductive pattern is more than 0 to less than 90 degrees, more preferably more than 0 to 45 degrees or less, and more preferably more than 0 to 30 degrees or less, but is not limited thereto. Herein, the taper angle means an angle between an end of the conductive pattern and a lower layer thereof, that is, a surface of the substrate. The taper angle may be measured by an angle between a straight line having an average slope of tangents from an end point of the conductive pattern to a point at which an upper surface of the conductive pattern start to be flat and a lower layer surface thereof. In the present invention, the conductive pattern having a small taper angle may be provided by using the method unlike the related art.

In step c), the line width of the conductive pattern may be controlled according to an etching time for forming the conductive pattern. As the etching time is longer, the line width of the conductive pattern may be thinly formed.

Figure 6:
FIG. 6 is a photograph illustrating a line width of a conductive pattern according to over-etching degree.

In the present invention, the etching time for forming the conductive pattern may vary according to a condition such as a kind or concentration of etchant used in the formation of the conductive pattern, a kind of conductive layer, an etching temperature, and the like. For example, the etching time is a just-etching time to a time more extended by 2,000% than the just-etching time, preferably a time more extended by 1 to 1,000% than the just-etching time, more preferably a time more extended by 1 to 500% than the just-etching time, and further more preferably a time more extended by 5 to 100% than the just-etching time. Herein, the just-etching time means a time required when a pattern is etched in the same shape as the shape of the mask. The line width of the conductive pattern according to the etching time was shown in FIG. 6.

The etching temperature of the conductive layer may also vary according to a condition such as a kind or concentration of etchant used in the patterning of the conductive layer, a kind of conductive layer, an etching temperature, and the like and for example, may be room temperature to 80 degrees, and preferably 30 to 70 degrees.

The etching method may be a deep etching method, a spray method, or the like, but more preferably the spray method for uniform etching.

When the conductive layer is a multilayer film, an etchant for etching the multilayer film at the same time and at almost the same speed may be used.

After etching the conductive layer by using the etching resist pattern as a mask, the etching resist pattern may be removed like step e), but the conductive layer without removing the etching resist pattern may be used to the touch screen as it is. Further, like step f), the conductive pattern may be covered by reforming the etching resist pattern.

In step e), the etching resist pattern may be removed by using a known method in the art according to a kind of etching resist pattern material.

In step f), "covering" means that the etching resist pattern which reflows while the shape is changed contacts the side of the conductive pattern and the substrate to insulate the conductive layer from the outside. In addition, in the present invention, "reforming" defined in the specification means that the etching resist pattern has mobility and the shape thereof is changed to cover the conductive pattern disposed at the lower portion.

In step f), the etching resist pattern may be reformed by modifying the etching resist pattern having the mobility by heat, solvent or fume (fume of the solvent), or plasma processing and then, curing the etching resist pattern by an additional processing of heat or plasma or the removal of the solvent, in which is a chemical processing. Or, a pressure may be applied to the etching resist pattern to be physically deformed.

The etching resist pattern may be reformed by using heat or a solvent (or fume of the solvent) and in this case, the plastic or curable polymer material may be used as the material of the etching resist pattern, as described above.

In the case of reforming the etching resist pattern by the heat, as the heat is applied, the material of the etching resist pattern has mobility to sink to a space between the substrate and the etching resist pattern and then, as the heat is further applied, the material is cured to loss the mobility. In this case, the heating temperature may be properly selected by the person with ordinary skill in the art according to the material of the etching resist pattern. The heating condition may be controlled so that the etching resist pattern has a desired cross-linking degree, for example, 10 to 100% or a desired insulating property, for example, leakage current of $10^{-1}$ ampere or less. For example, the heating may be performed at the temperature of 120° C. to 350° C. to be increased by 5° C./min to 60° C./min. In addition, heating of the same temperature or duplicate heating of different temperatures may be also performed. As a detail example, when the imide-based resin is used as the etching resist pattern material, the heating may be performed at the temperature of 250° C. to 300° C. As another example, when the novolac-based resin is used as the etching resist pattern material, the heating may be performed at the temperature of 120° C. to 140° C.

When the etching resist pattern is reformed by using the solvent or the fume of the solvent, the etching resist pattern may be exposed at the atmosphere of the fume of the solvent (solvent annealing). As a result, when the etching resist pattern material reacts with the solvent, the etching resist pattern material has mobility and the etching resist pattern is deformed to contact the substrate. Thereafter, when the solvent is removed by heating at a predetermined temperature in which the solvent is dried, the etching resist pattern material is cured to loss the mobility. Such a reforming method is preferable. In this case, the solvent may be properly selected by the person with ordinary skill in the art according to the etching resist pattern material and may be selected from a solvent group in which the etching resist pattern material is soluble. For example, when the novolac-based resin is used as the etching resist pattern material, IPA may be used as the solvent. Further, a dry temperature may be around a melting temperature of the selected solvent and preferably from room temperature to 300° C., but is not limited thereto.

In the present invention, a baking process may be performed during or after step b) of forming the etching resist pattern (FIGS. 1 to 4). In detail, the baking process may be performed after forming the etching resist pattern after forming the etching resist layer on the substrate during step b), or before forming the conductive pattern in step c). The baking may be performed so as to prevent the modification of the etching resist pattern in the baking step or subsequent steps by making the adhesion between the etching resist pattern and an adjacent layer thereto and simultaneously, at least partially curing the etching resist pattern and thereafter, stably form a reflowing shape of the etching resist pattern in the reformation of the etching resist pattern, if necessary. The curability of the etching resist pattern desired to be accomplished in the baking process may be determined by the person with ordinary skill in the art according to the material of the etching resist pattern or a condition for the reforming to be subsequently performed, if necessary and for example, the curability may be in the range of 0 to 100%.

The condition of the baking process may be selected by the person with ordinary skill in the art according to a material of the etching resist pattern, a thickness of the etching resist pattern, and an etching condition used to form the conductive wire, for example, a kind of etchant, an etching time, an etching temperature, and the like. If the baking temperature is very high, the cross-linking degree of the etching resist pattern is very high, such that the modification, for example, distortion of a pattern area and the like may occur.

As one example, when the etching resist pattern is formed by using novolac-based polymer and the photolithography method, the baking may be performed at the temperature of 80 to 150° C. for 2 to 3 minutes. As another example, when the etching resist pattern is formed by using novolac-based polymer and the printing method, the baking may be performed at the temperature of 125 to 130° C. for 2 to 3 minutes. As another example, when the etching resist pattern is formed by using acryl-based polymer, the baking may be performed at the temperature of 170 to 230° C. for 5 to 60 minutes. As another example, when the etching resist pattern is formed by using PSPI polymer, the baking may be performed at the temperature of 120 to 300° C. for 1 to 60 minutes.

When the baking temperature is very low, it is difficult to acquire a cross-linking effect according to the baking and when the baking temperature is very high, the shape may be deformed due to the distortion of the etching resist pattern. The baking time may vary according to the material or the process condition described above and for example, may be about 2 to 3 minutes, but is not limited thereto.

In the present invention, when the UV curable resin is used as the etching resist pattern material, the exposure and the firing may be performed during or after step b). The example was shown in FIG. 5.

The method according to the present invention may further comprise washing after steps c), e), and f). The washing may be performed by using the etchant used in step c). The washing may remove foreign substances.

The touch screen according to an exemplary embodiment of the present invention has a low taper angle of the conductive pattern and the taper angle is less than 90 degrees, preferably 45 degrees or less, and more preferably 30 degrees or less.

Figure 7:
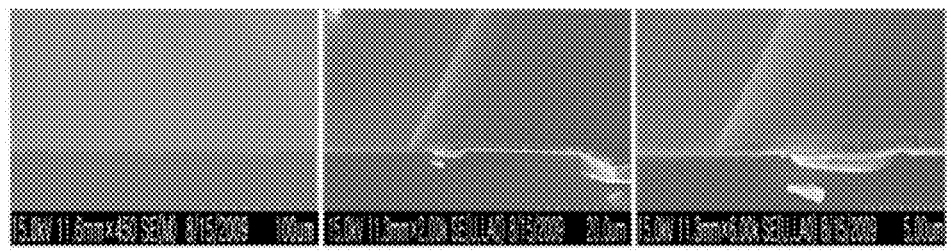
FIG. 7 is a photograph illustrating the case where an etching resist pattern comprises a remaining region and an area having different hardness in a touch screen according to an exemplary embodiment of the present invention.
Figure 8:
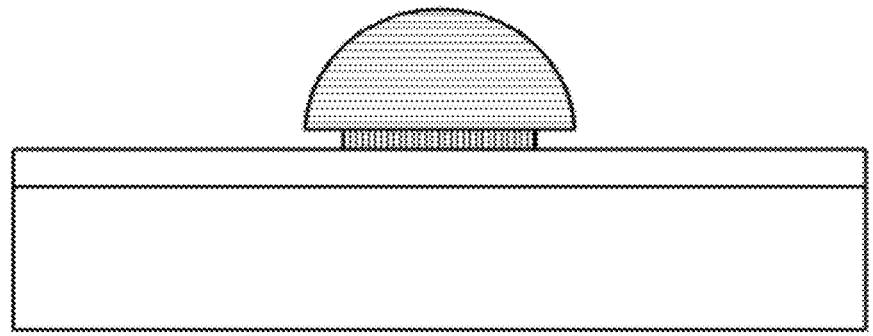
FIGS. 8 to 11 are exemplified diagrams illustrating a structure in which an etching resist pattern having a line width larger than a line width of the conductive pattern is provided on the conductive pattern.
Figure 9:
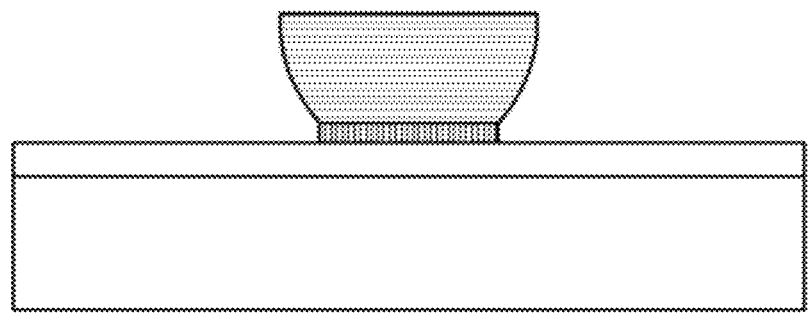
Figure 10:
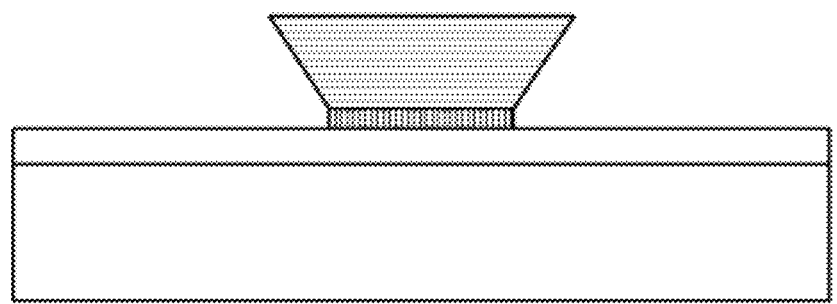
Figure 11:
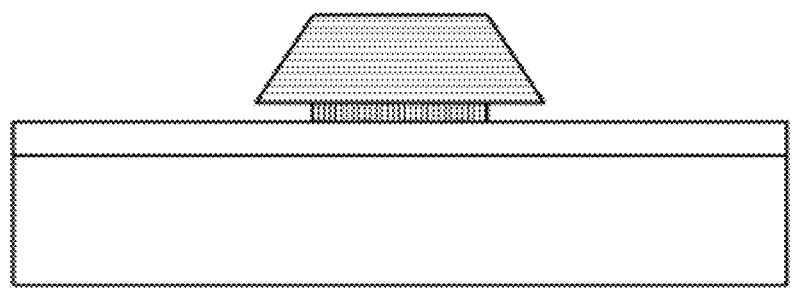

In the present invention, when performing step f), in the touch screen according to the present invention, the etching resist pattern may comprise a remaining region and a region having different hardness depending on a material of the etching resist pattern. The remaining region and the region having different hardness may occur at an interface of a region at which the etching resist pattern is not reformed and a region at which the etching resist pattern is reformed and may be formed in a band shape at the interface. The band may have an upwardly protruding shape compared with the rest regions in the cross-section. The band shape may be observed in FIG. 7.

In the present invention, by reforming the etching resist pattern, a distance between an end point of the conductive pattern and an end point of the etching resist pattern may be controlled by 0 to 1 micrometer or 5 micrometers or more. In particular, when the thermosetting resin is used as the etching resist pattern material, the distance between an end point of the conductive pattern and an end point of the etching resist pattern may be much shorter as 0 to 1 micrometer. Meanwhile, when a thermoplastic resin is used as the etching resist pattern material, the distance between an end point of the conductive pattern and an end point of the etching resist pattern may be relatively long by 5 micrometers or more.

In the present invention, when the etching resist pattern is reformed, a void may be observed between the conductive pattern and the etching resist pattern. This is different from the related art in which the void is not observed when the insulating layer is formed on the conductive pattern. In the present invention, a thickness of the void (the shortest distance between the longest side and the shortest side) is preferably from more than 0 to a thickness of the conductive pattern or less and more preferably more than 0 to 0.7 or less of the thickness of the conductive pattern.

In the touch screen according to an exemplary embodiment of the present invention, the taper angle of the reformed etching resist pattern may be larger than the taper angle of the conductive pattern.

In the touch screen manufactured by the method according to the present invention, a shape of a cross-section of the reformed etching resist pattern may be a semicircle.

In the touch screen according to an exemplary embodiment of the present invention, a line width of the conductive pattern is not particularly limited, but the conductive pattern may have a fine line width of 100 micrometers or less, preferably 0.1 to 30 micrometers, more preferably 0.5 to 10 micrometers, and further more preferably 1 to 5 micrometers. In particular, in the described method, when etching the conductive layer by using the etching resist pattern as a mask, more fine line width may be implemented by forming the undercut by the over-etching.

Figure 12:
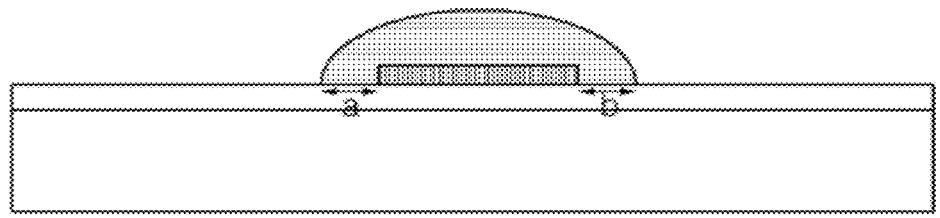
FIGS. 12 to 15 are exemplified diagrams illustrating an insulating layer pattern which is disposed in a symmetric structure with respect to the conductive pattern.
Figure 13:
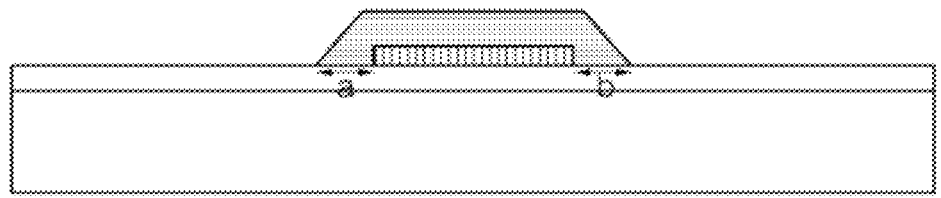
Figure 14:
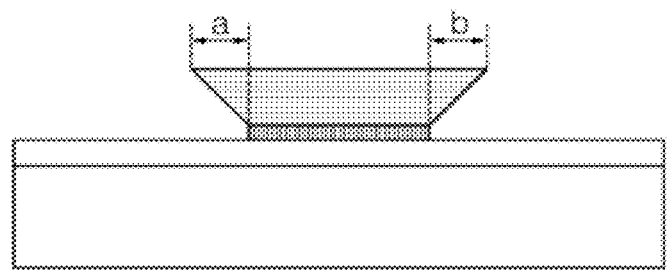
Figure 15:
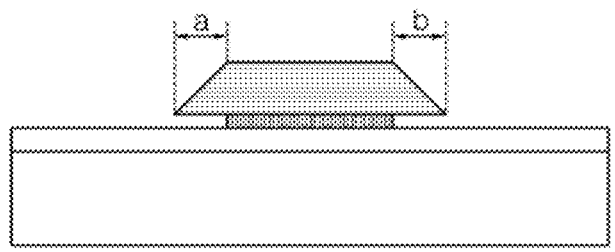

The touch screen according to the present invention may further comprise an insulating layer pattern disposed on the conductive pattern and covering the conductive pattern or an etching resist pattern having a pattern corresponding to the conductive pattern and having a line width larger than a line width of the conductive pattern. The insulating layer pattern covering the conductive pattern may have a structure as shown in FIGS. 12 and 13 and the etching resist pattern having a pattern corresponding to the conductive pattern and having a line width larger than a line width of the conductive pattern may have a structure as shown in FIGS. 8 to 11. However, the scope of the present invention is not limited by the drawings.

The structure may be manufactured without removing the etching resist pattern used as the mask for forming the conductive pattern, after forming the conductive pattern by the described method. In this case, the etching resist pattern may have insulating properties.

When the etching resist pattern is formed on the conductive pattern, an optical property can be additionally given by controlling a kind of the etching resist pattern material and a tri-dimensional shape thereof. The structure, in which the etching resist pattern having a line width larger than a line width of the conductive pattern is provided on the conductive pattern according to the present invention, was shown in FIGS. 8 to 11. However, it is not limited to only the structure shown the drawings and may have other structures, and the etching resist pattern may be removed.

The touch screen according to an exemplary embodiment of the present invention comprises a substrate; a conductive pattern formed on at least one side of the substrate; and an insulating layer pattern covering the conductive pattern or an insulating layer pattern having a pattern corresponding to the conductive pattern and a line width larger than the line width of the conductive pattern, in which in a cross-section of the line width direction of the conductive pattern, a percentage $a/b*100$ of a distance a from one end of the conductive pattern to the insulating layer pattern and a distance b from the other end of the conductive pattern to the insulating layer pattern is in the range of 90 to 110. The percentage is preferably 95 to 105 and more preferably 99 to 101. In the method according to the present invention, the insulating layer pattern and the conductive pattern are not formed by using an additional mask or an additional printing method, and the conductive pattern is formed by using the insulating layer pattern as a mask and thereafter, the insulating layer pattern is reformed to be used, such that the insulating layer pattern disposed on the conductive pattern may be symmetric to the conductive pattern. The symmetric structure was exemplified in FIGS. 12 to 15, but the scope of the present invention is not limited to the structure.

Figure 16:
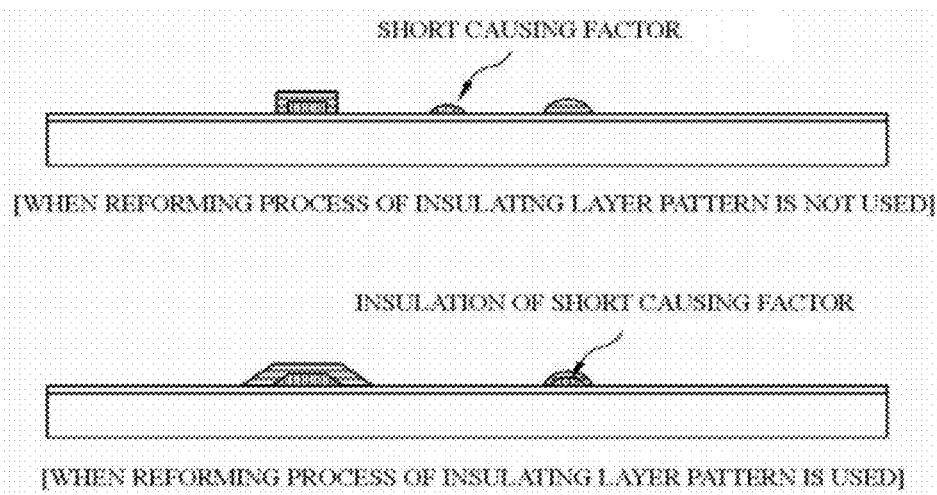
FIG. 16 is a schematic diagram illustrating an effect in that a cause of a short generation can be removed by using a method according to the present invention.

According to the method of the present invention, although a pattern defect occurs at the time of the formation of the etching resist pattern or the conductive pattern during the manufacturing process of the touch screen, an insulated conductive pattern without the short may be provided. Herein, the pattern defect means that the insulating pattern for forming the conductive pattern is formed at portions other than the pattern shape. In the present invention, the etching resist pattern used to form the conductive pattern is not removed and the shape thereof is reformed, such that the etching resist pattern is used to insulate the conductive pattern. As a result, the conductive pattern which is not insulated by the insulating pattern does not exist. Accordingly, although the pattern defect occurs at the time of the formation of the etching resist pattern or the conductive pattern, the foreign substances such as the conductive material are not left on the substrate, such that the short does not occur. In the related art, the conductive pattern is not entirely covered due to the pattern defect of the insulating layer pattern or the conductive pattern which is not covered by the insulating layer pattern exists due to the pattern defect of the conductive pattern, such that the short may occur. On the other hand, in the present invention, an error rate may be largely reduced by the reasons described above and an additional washing or etching process for removing the defect area of the conductive pattern, which is required for the related art, may not be required. The effect of the present invention is shown in FIG. 16. Therefore, according to the method of the present invention, an insulated conductive pattern in which a short caused due to the defective pattern is not substantially occurred can be provided.

Figure 17:
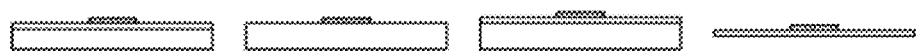
FIGS. 17 to 19 are exemplified diagrams illustrating a side structure of a touch screen according to an exemplary embodiment of the present invention.
Figure 18:
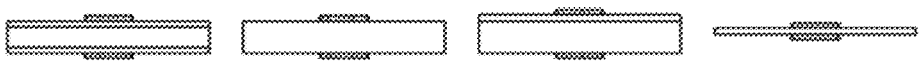

The touch screen comprising the conductive pattern according to the exemplary embodiment of the present invention was exemplified in FIGS. 17 and 18. FIG. 17 shows a structure in which the conductive pattern is provided at one side of a single layer or a multilayer base and FIG. 18 shows a structure in which the conductive pattern is provided at both sides of a single layer or a multilayer base.

Figure 19:
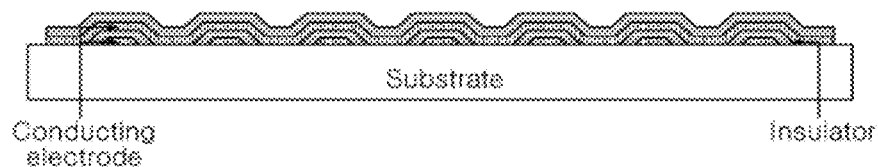

As one example of an electronic element according to an exemplary embodiment of the present invention, a structure of the touch screen was shown in FIG. 19. The touch screen shown in FIG. 19 comprises a substrate, a first conductive pattern disposed on the substrate, a first insulating layer disposed on the first conductive pattern, a second conductive pattern disposed on the first insulating layer, and a second insulating layer disposed on the second conductive pattern.

However, the scope of the present invention is not limited to FIGS. 17 to 19.

Figure 20:
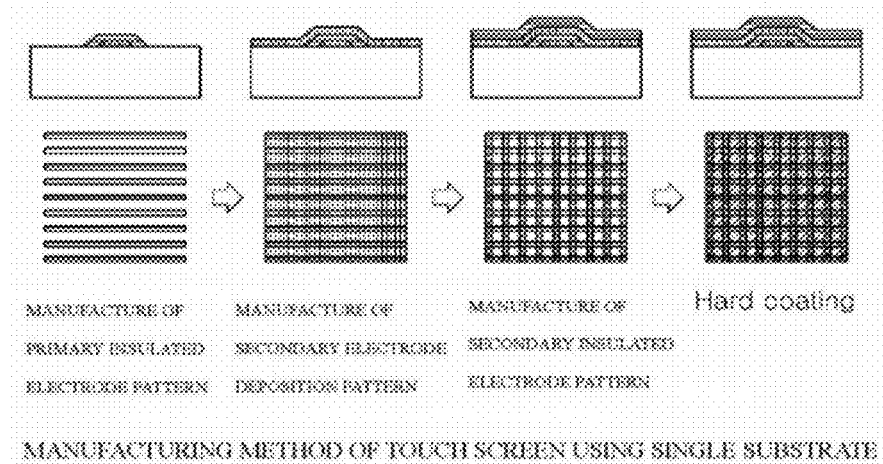
FIGS. 20 to 21 are exemplified diagrams illustrating a method of manufacturing a touch screen according to an exemplary embodiment of the present invention.
Figure 21:
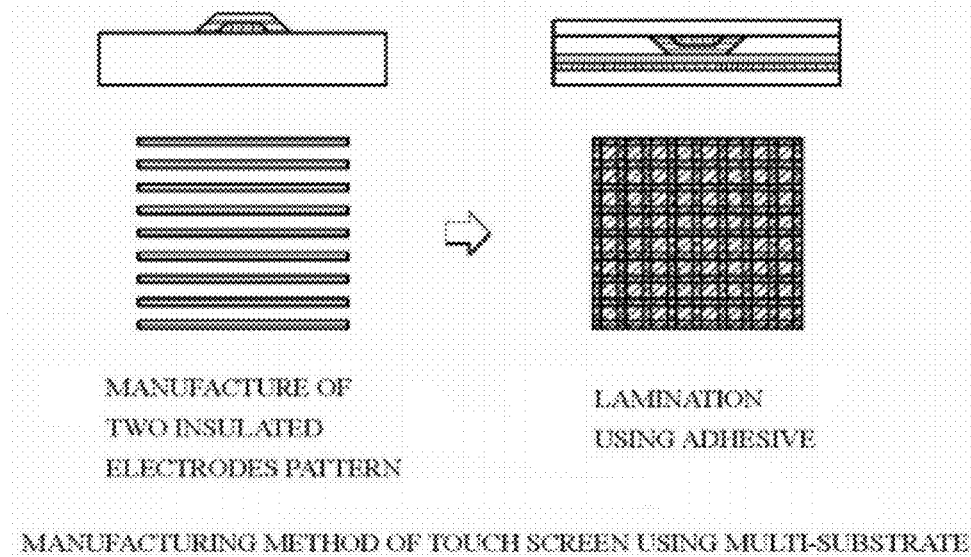

The method of manufacturing the touch screen according to the present invention is exemplified in FIGS. 20 and 21. FIG. 20 shows an example where a touch screen is manufactured by using a single substrate and FIG. 21 shows an example where a touch screen is manufactured by forming a conductive pattern and then, laminating the conductive pattern by using two sheets of substrates.

Figure 22:
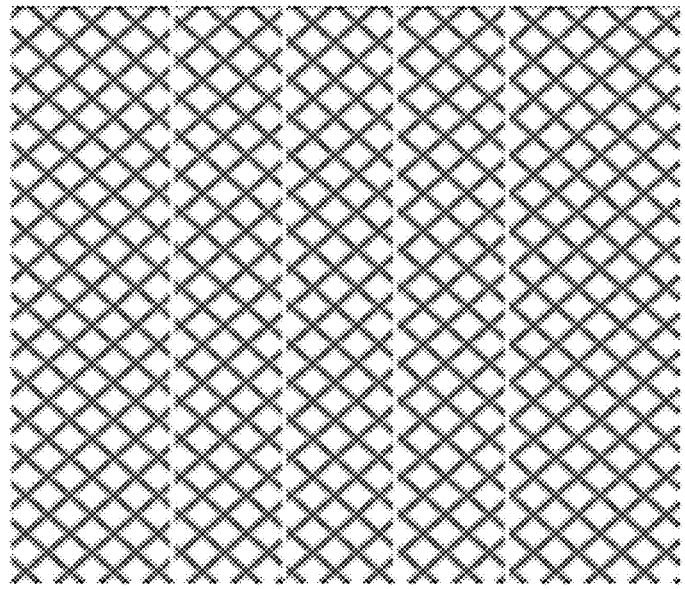
FIGS. 22 to 23 are exemplified diagrams illustrating a state in which a conductive pattern is divided in a touch screen according to an exemplary embodiment of the present invention.
Figure 23:
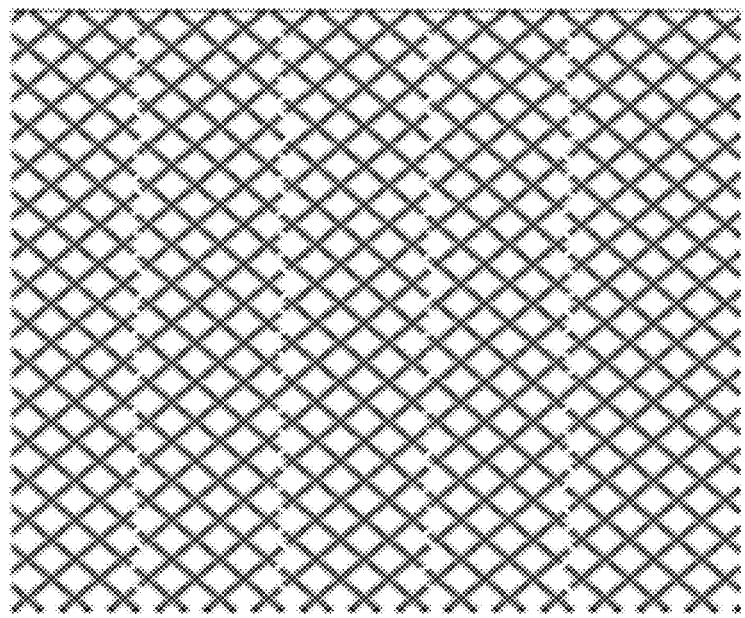
Figure 38:
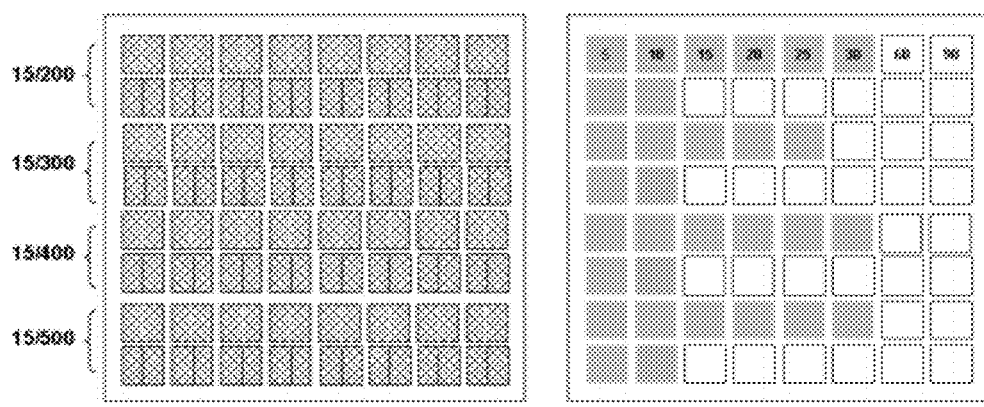
FIGS. 38 to 39 are exemplified diagrams illustrating a result of evaluating visibility in the case where a mesh shape of conductive pattern is divided and in the case where a conductive wire is put on a mesh shape of conductive pattern.
Figure 39:
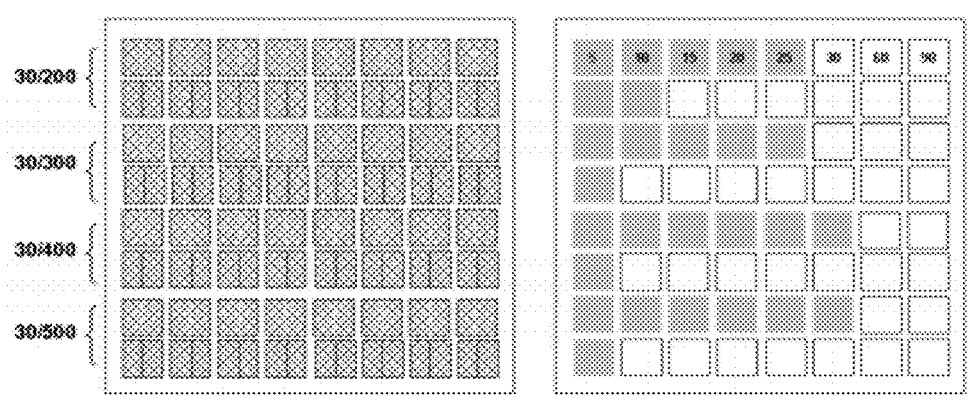

The conductive pattern of the touch screen according to the present invention may be divided by a straight line and a curved line. Herein, the division means that the conductive pattern is disconnected by a specific pattern. By the division, the recognition of an external touch may be increased and the transparency may be improved. A divided shape is not particularly limited and may be a straight line, a curved line, a zigzag, or the like considering easiness in the manufacturing process and for example, may be shapes shown in FIGS. 22 and 23. A visibility evaluation result was shown in FIG. 38, when a mesh having a line width of 15 micrometers and a pitch of 200 micrometers is divided into a line in which each line width is changed up to 5 to 90 and when the conductive wire is placed on the mesh. Further, a visibility evaluation result was shown in FIG. 39, when a mesh having a line width of 30 micrometers and a pitch of 200 micrometers is divided into a line in which each line width is changed up to 5 to 90 and when the conductive wire is placed on the mesh. A shade-marked area of the visibility evaluation result (right) corresponds to an area where a person does not easily recognize.

Figure 24:
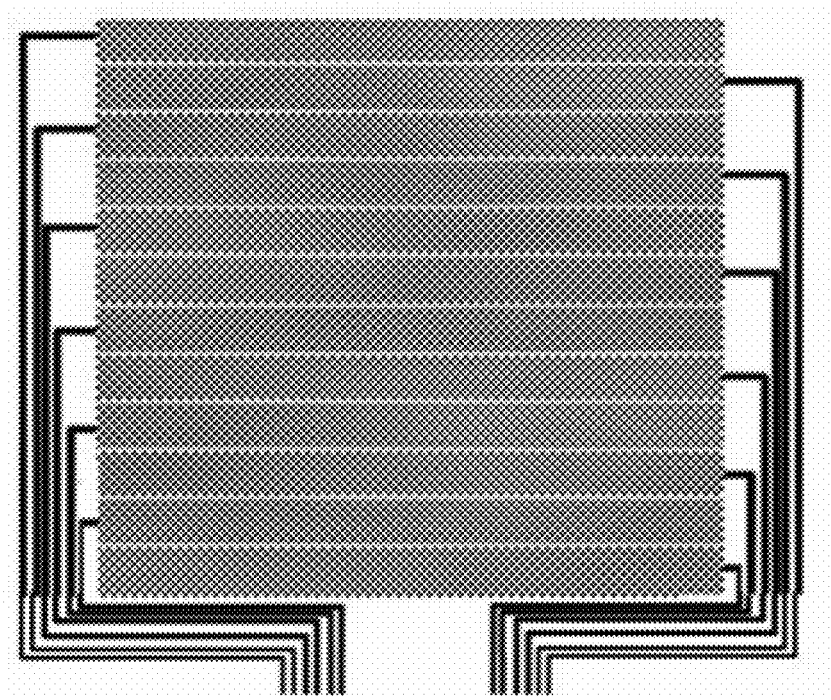
FIGS. 24 to 25 are exemplified diagrams illustrating a structure in which a touch screen according to an exemplary embodiment of the present invention is connected to external voltage.
Figure 25:
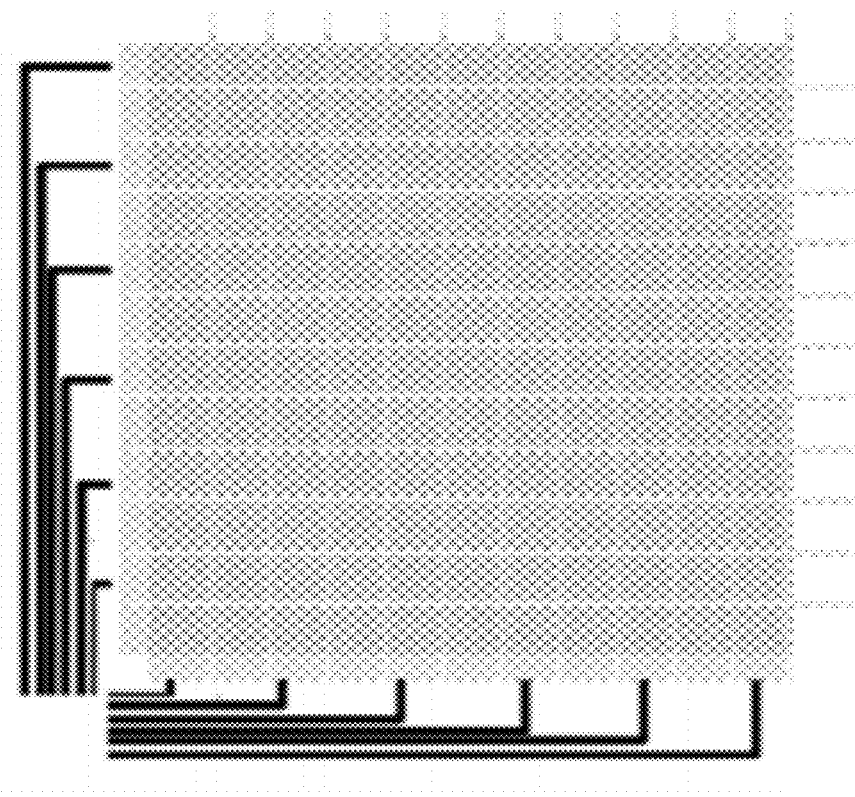

The touch screen according to the present invention may be connected to external voltage and in this case, may have a structure as shown in FIGS. 24 and 25, but is not particularly limited. An insulating layer of a PAD part of a wire connected to the external voltage may be removed.

A sheet resistance of the conductive pattern of the touch screen according to the present invention may be 200 to 0.001 ohm/square.

A thickness of the conductive pattern of the touch screen according to the present invention is preferably 10 micrometers or less, more preferably 300 nm or less, and further more preferably 100 to 300 nm. A specific resistance value may be determined according to a kind of composition of the conductive pattern and a sheet resistance value may be controlled according to a thickness of the conductive pattern. In the present invention, by using the method of forming the conductive pattern by using the etching resist pattern as a mask as described above, the conductive pattern having a thinner thickness may be acquired as compared with the case where the conductive pattern is directly printed.

The conductive pattern of the touch screen according to the present invention has an aperture ratio of 85% to 98%, a sheet resistance of 1 ohm to 200 ohm, a thickness of 100 to 300 nm, and a line width of 0.1 to 10 micrometer and satisfies the following equation 1.

$$a/(1-\text{aperture ratio})=A \qquad \text{[Equation 1]}$$

In Equation 1, a is is a sheet resistance in a thickness t of a layer made of a material constituting the conductive pattern and A is a sheet resistance in a thickness t of the conductive pattern. The conductive pattern according to the present invention may satisfy the following equations 2 and 3.

$$a/[1-(R-L)^2/R^2]=A \qquad \text{[Equation 2]}$$

$$(R-L)^2/R^2 \times Ts = Tc \qquad \text{[Equation 3]}$$

In Equations 2 and 3, R is a pitch of the conductive pattern, L is a line width of the conductive pattern, a is a sheet resistance in a thickness t of a layer made of a material constituting the conductive pattern, A is a sheet resistance in a thickness t of the conductive pattern, Ts is transmittance of the substrate in itself, and Tc is transmittance of the substrate having the conductive pattern.

In this specification, the aperture ratio means a ratio of an area in which the conductive pattern is not formed in an overall laminated body and the transmittance means a transmission ratio of light shown when visible light passes through the substrate.

The conductive pattern of the touch screen according to the present invention preferably has a deviation of thicknesses of the conductive pattern within 3% for each position and more preferably within 2%. The conductive pattern according to the present invention preferably has a deviation of line widths within 30% for each position and more preferably within 20%. In the present invention, by using the etching resist pattern as a mask in forming the conductive pattern, the deviation of the thicknesses and/or the line widths of the conductive pattern may be reduced, as compared with the related art in which the conductive pattern is formed by directly printing the conductive ink and the paste.

The conductive pattern of the touch screen according to the present invention preferably has a pattern form continuously formed in an area of 7 inch or more and preferably has an area of 10 to 50 inches. Herein, the continuously-formed pattern form means that a connection trace is absent. In the present invention, by using the over-etching method described above, the conductive pattern having an ultrafine line width may be formed in a large area without the connection trace. The conductive pattern having the ultrafine line width in the large area is not implemented by the related art. The connection trace means a trace for implementing the large area by connecting the conductive patterns having a small area to each other and for example, the method of connecting the conductive patterns in a small area by using a pad part may be used. In this case, the transmittance is preferably 85% to 98% and the conductivity is preferably 0.1 to 100 ohms. When an electronic apparatus having minimum electrical conductivity and using the same is attached to an electronic device such as a display, they are design numerical values for preventing the attachment from being significantly recognized.

The conductive pattern comprised in the touch screen may be regular or irregular. A pitch of the regular pattern may be several to 2000 micrometers, preferably 500 micrometers or less, and more preferably 250 micrometers or less. A pitch of the conductive wire pattern of the touch screen may be smaller than a size of a pixel of a display.

In an exemplary embodiment, the conductive pattern comprised in the touch screen may be formed by closed figures distributed continuously in an area of 30% or more, preferably 70% or more, and more preferably 90% or more of an overall area of the substrate and may have a shape where a ratio of standard deviation for an average value of areas of the closed figures (a ratio of area distribution) may be 2% or more. As a result, a moire phenomenon may be prevented and excellent electric conductivity and optical properties may be satisfied.

The number of the closed figures may be at least 100.

The ratio of standard deviation for an average value of areas of the closed figures (a ratio of area distribution) is preferably 2% or more, more preferably 10% or more, and further more preferably 20% or more.

The pattern formed by the closed figures having the ratio of standard deviation for an average value of areas (a ratio of area distribution) of 2% or more may be 30% or more for the overall area of the substrate. Other shapes of conductive pattern may be at least partially formed on the surface of the substrate with the conductive pattern.

Figure 26:
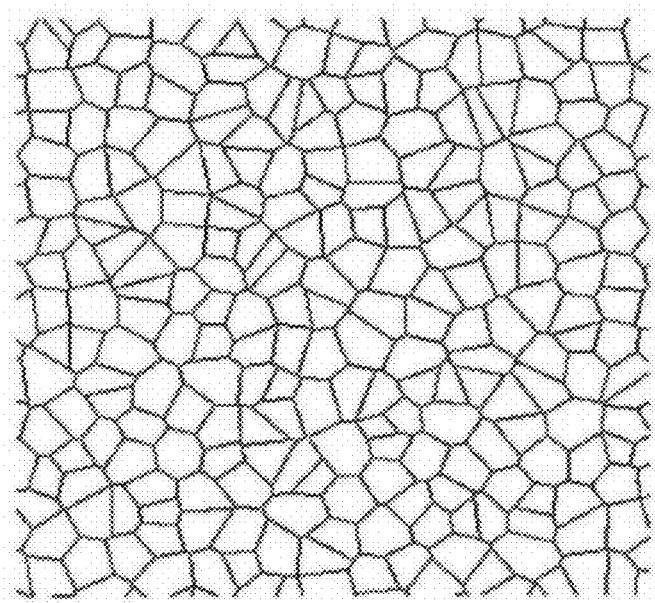
FIGS. 26 to 29 are exemplified diagrams illustrating a conductive pattern of a touch screen according to an exemplary embodiment of the present invention.

FIG. 26 exemplifies a conductive pattern of a touch screen according to an exemplary embodiment of the present invention. The ratio of area distribution of the pattern is 20% or more, for example, 20% to 35%.

In another exemplary embodiment, when the conductive pattern comprised in the touch screen shows a straight line crossing the conductive pattern in an area of 30% or more, preferably 70% or more, and more preferably 90% or more of an overall area of the substrate, a ratio of standard deviation for an average value of distances between the straight line and adjacent contact points of the conductive pattern (a ratio of distance distribution) may be 2% or more. As a result, a moire phenomenon may be prevented and excellent electric conductivity and optical properties may be satisfied.

The straight line crossing the conductive pattern may be a line having minimum standard deviation of distances between the conductive pattern and the adjacent contact points. In addition, the straight line crossing the conductive pattern may be a straight line extending in a vertical direction to a tangent of any one point of the conductive pattern.

The straight line crossing the conductive pattern may have contact points of 80 or more with the conductive pattern.

The ratio of standard deviation for an average value of distances between the straight line crossing the conductive pattern and adjacent contact points of the conductive pattern (a ratio of distance distribution) is preferably 2% or more, more preferably 10% or more, and further more preferably 20% or more.

The pattern having the ratio of standard deviation for an average value of distances between the straight line crossing the conductive pattern and adjacent contact points of the conductive pattern (a ratio of distance distribution) of 2% or more may be formed at an area of 30% or more for the overall area of the substrate. Other shapes of conductive pattern may be at least partially formed on the surface of the substrate with the conductive pattern.

Figure 27:
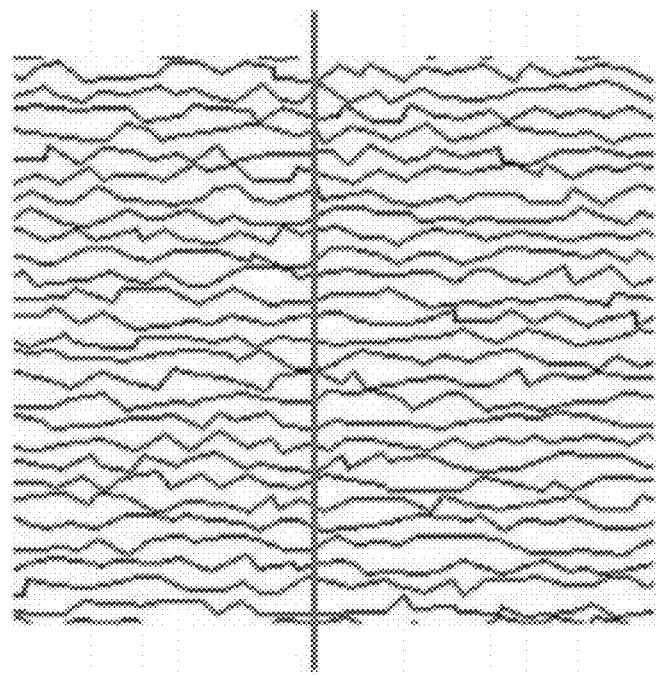
Figure 28:
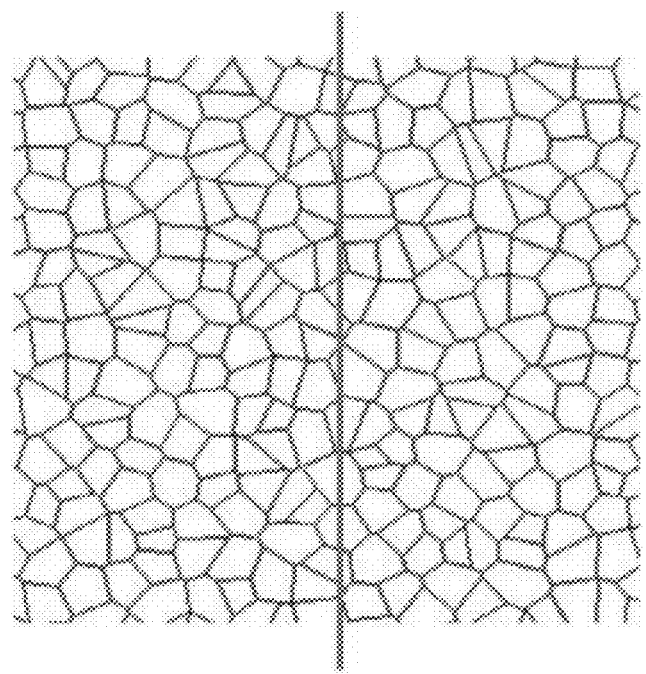
Figure 29:
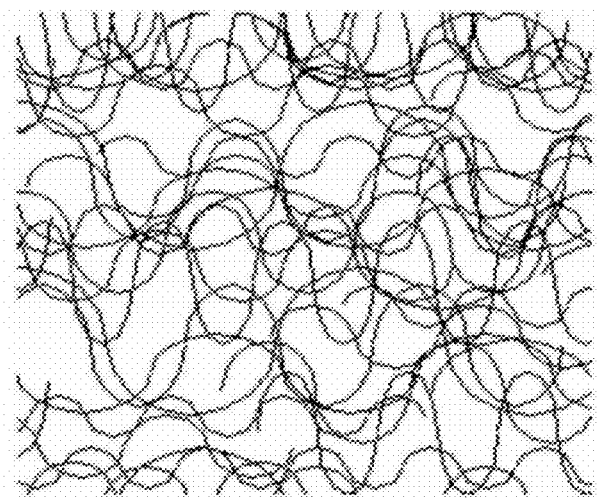

FIGS. 27 and 28 shows the case where any line is drawn on the conductive pattern. However, the scope of the present invention is not limited thereto. FIG. 27 shows a one-dimensional form in which conductive patterns does not cross each other, and FIG. 28 shows a two-dimensional form in which the electric conductive patterns cross each other and shapes of closed figures are formed on at least some regions. Another example of the conductive pattern is shown in FIG. 29, but the scope of the present invention is not limited thereto.

In the touch screen according to the present invention, in order to implement uniform conductivity and visibility, the aperture ratio of the pattern may be uniform in a unit area. The substrate having the conductive pattern may have transmittance deviation (based on an area without artificial pattern disconnection part) of 5% or less which is measured at the inside of any circle having a diameter of 0.5 cm in an effective screen part and at n positions of in the touch screen. In this case, local conductivity in the substrate having the conductive pattern may be prevented.

In the present invention, the conductive pattern may be formed by straight lines, but may be variously modified in curved lines, wave lines, zigzag lines. In addition, at least two of the shaped lines may be mixed.

According to an exemplary embodiment of the present invention, the conductive pattern may have a boundary shape of figures forming a Voronoi diagram.

Figure 30:
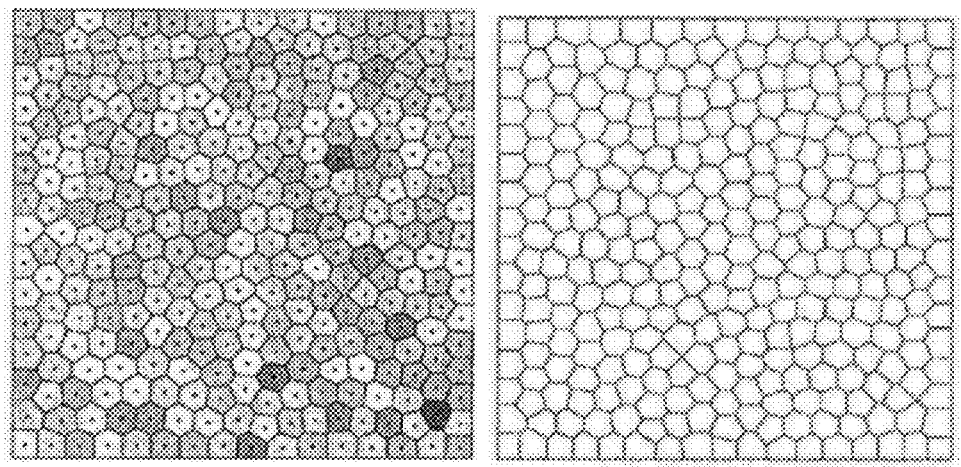
FIG. 30 is an exemplified diagram illustrating a pattern formation using a Voronoi diagram generator.
Figure 31:
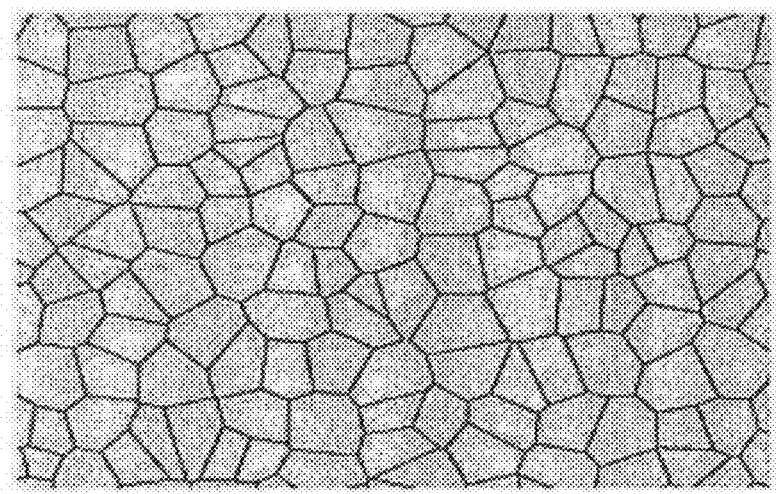
FIGS. 31 to 33 are exemplified diagrams illustrating a conductive pattern of a touch screen according to an exemplary embodiment of the present invention.
Figure 32:
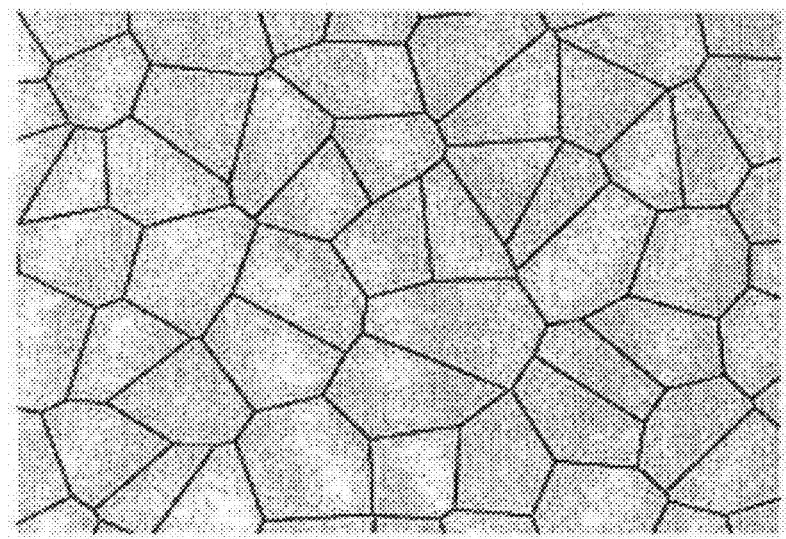
Figure 33:
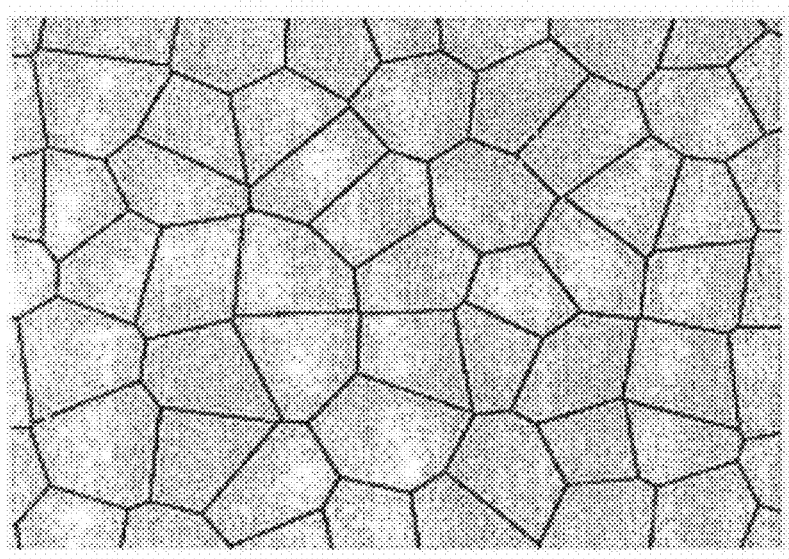

In the present invention, the moire phenomenon may be prevented by forming the conductive pattern in the boundary shape of figures forming a Voronoi diagram. The Voronoi diagram is a pattern formed by filling a region in which a distance between each point and the corresponding point is the nearest as compared with a distance from other points when the points called a Voronoi diagram generator are disposed at a region to be filled. For example, when national large-sized retailers are marked by points and customers visits the nearest large-sized retailer, a pattern marking a business district of each large-sized retailer may be exemplified. That is, a honeycomb structure in which a space is filled with regular hexagons and each point of the regular hexagons is selected by the Voronoi diagram generator may form the conductive pattern. In the present invention, when the conductive pattern is formed by using the Voronoi diagram generator, a complicate pattern form which can prevent the moire phenomenon generated by interference with other regular patterns may be easily determined. FIG. 30 exemplifies a pattern formation using a Voronoi diagram generator. One example of the conductive pattern is shown in FIGS. 31 to 33, but the scope of the present invention is not limited thereto.

In the present invention, the Voronoi diagram generator is regularly or irregularly positioned, such that the pattern derived from the generator may be used.

Even when the conductive pattern is formed in a boundary shape of the figures forming the Voronoi diagram, in order to solve the problem on the visible perception described above, the Voronoi diagram generator is generated so that regularity and irregularity are properly controlled. For example, the Voronoi pattern may be prepared by designating a predetermined size of area as a basic unit in an area having the pattern and generating points having irregular distribution in the basic unit. Distribution of lines is not concentrated in any one point by using the method, such that visibility may be complemented.

As described above, in order to implement uniform conductivity and visibility, when the aperture ratio of the pattern is uniform in the unit area, the number of the Voronoi diagram generators per unit area may be controlled. In this case, when the number of the Voronoi diagram generators per unit area is uniformly controlled, the unit area is preferably 5 cm$^2$ or less and more preferably 1 cm$^2$ or less. The number of the Voronoi diagram generators per unit area is preferably 25 to 2,500 numbers/cm$^2$ and more preferably 100 to 2,000 numbers/cm$^2$.

At least one of the figures forming the pattern in the unit area may have a different shape from the rest figures.

According to another exemplary embodiment of the present invention, the conductive pattern may have a boundary shape of figures formed by at least one triangle forming a Delaunay pattern. In detail, the shape of the conductive pattern may be a boundary shape of the triangles forming the Delaunay pattern, a boundary shape of figures formed by at least two triangles forming the Delaunay pattern, or a combined shape thereof.

Figure 34:
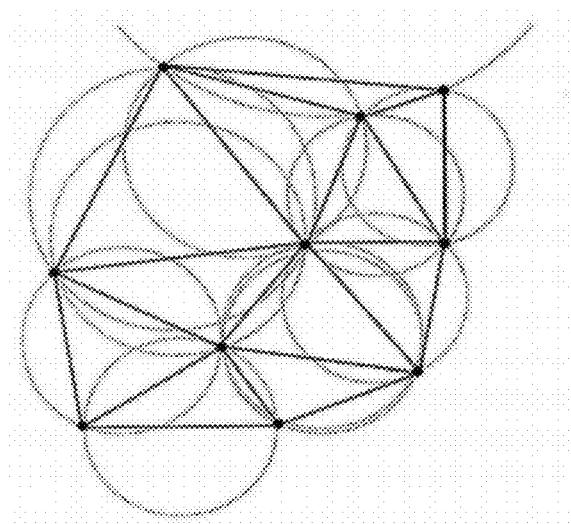
FIG. 34 is a diagram illustrating a forming example of a Delaunay pattern.
Figure 35:
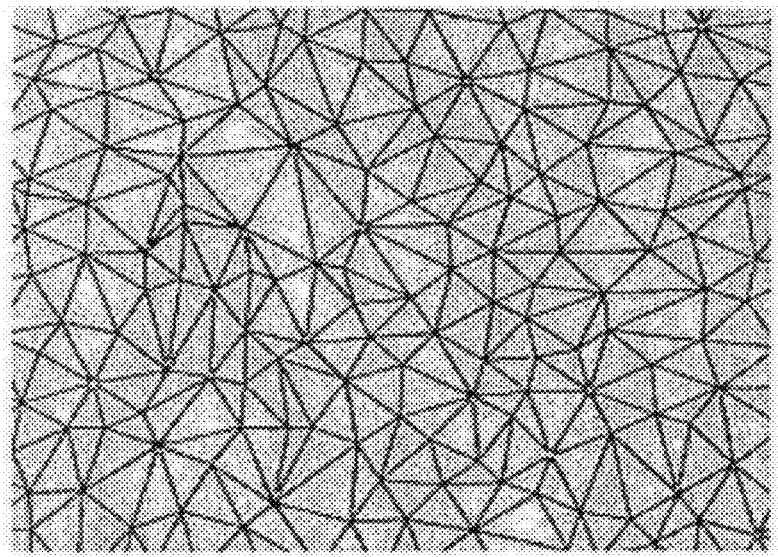
FIGS. 35 to 37 are exemplified diagrams illustrating a Delaunay pattern.
Figure 36:
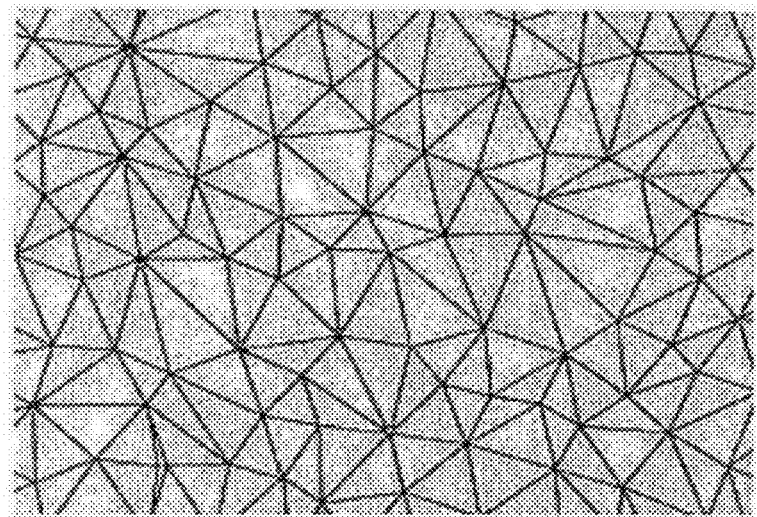
Figure 37:
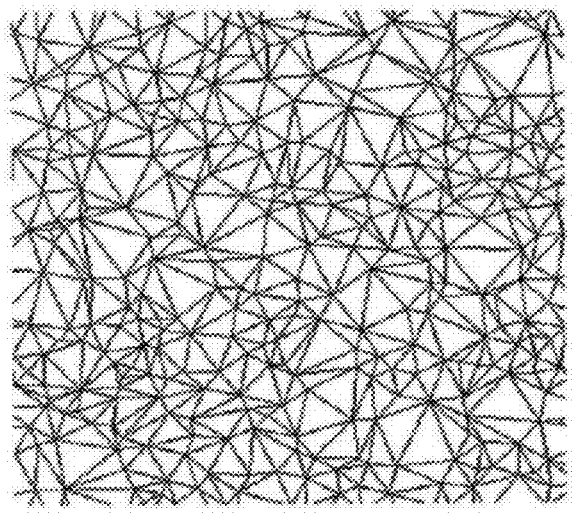

The conductive pattern is formed in the boundary shape of figures formed by at least one triangle forming a Delaunay pattern, such that side effect due to diffraction and interference of light may be minimized. The Delaunay pattern is a pattern in which points called Delaunay pattern generators are disposed in a region to fill the pattern and three adjacent points are connected to one another to draw a triangle, however, when a circumcircle comprising all of edges of the triangle is drawn, the triangle is drawn so that other points do not exist in the circumcircle. In order to form the pattern, Delaunay triangulation and circulation may be repeated based on the Delaunay pattern generator. The Delaunay triangulation may be preformed by maximizing a minimum angle of all angles of the triangle to avoid a thin triangle. The concept of the Delaunay pattern was proposed by Boris Delaunay in 1934. An example of forming the Delaunay pattern was shown in FIG. 34. In addition, an example of the Delaunay pattern was shown in FIGS. 35 to 37. However, the scope of the present invention is not limited just thereto.

In the pattern having the boundary shape of figures formed by at least one triangle forming a Delaunay pattern, the Delaunay pattern generators are regularly or irregularly positioned, such that pattern derived from the generators may be used. In the present invention, when the conductive pattern is formed by using the Delaunay pattern generator, a complicate pattern form which can prevent the moire phenomenon may be easily determined.

Even when the conductive pattern is formed in the boundary shape of figures formed by at least one triangle forming a Delaunay pattern, in order to solve the problems on the visible perception and the local conductivity, the Delaunay pattern generator is generated so that regularity and irregularity are properly controlled. For example, an irregular and uniform reference point is generated in an area inserting the pattern. In this case, the irregularity mean that a distance between the points is not uniform and the uniformity means that the number of points comprised in the unit area is the same.

Figure 45:
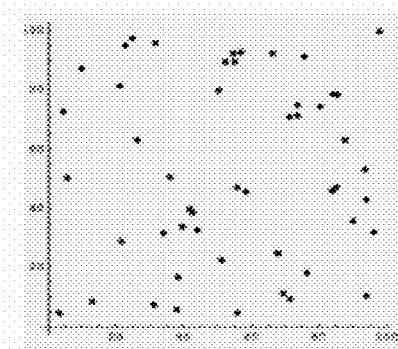
FIG. 45 is an exemplified diagram illustrating a method of generating irregular and uniform reference points in order to form a conductive pattern.
Figure 45:
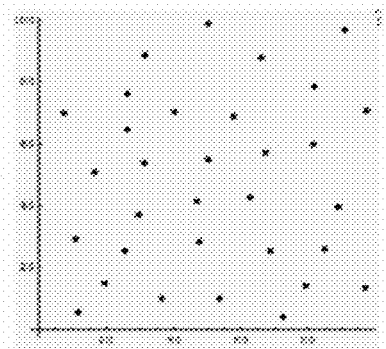

The method of generating the irregular and uniform reference points is as described below. As shown in FIG. 45A, any point is generated in an overall area. Thereafter, an interval between the points is measured and when the interval between the points is smaller than a predetermined value, the points are removed. Further, a Delaunay triangle pattern is generated based on the points and when the area of the triangle is larger than a predetermined value, the point is added at the inside of the triangle. The processes are repetitively preformed to generate the irregular and uniform reference points as shown in FIG. 45B. Thereafter, Delaunay triangles comprising one by one of the generated reference points are generated. This step may be performed by using the Delaunay pattern. Distribution of lines is not concentrated at any one point by using the method, such that visibility may be complemented.

As described above, in order to have uniform conductivity and visibility, when the aperture ratio of the pattern is uniform in the unit area, the number of the Delaunay pattern generators per unit area may be controlled. In this case, when the number of the Delaunay pattern generators per unit area is uniformly controlled, the unit area is preferably 5 cm$^2$ or less and more preferably 1 cm$^2$ or less. The number of the Delaunay pattern generators per unit area is preferably 25 to 2,500 numbers/cm$^2$ and more preferably 100 to 2,000 numbers/cm$^2$.

At least one of the figures forming the pattern in the unit area may have a different shape from the rest figures.

According to an exemplary embodiment of the present invention, at least a part of the conductive pattern may be artificially different from the rest pattern. A desired conductive pattern may be acquired by the constitution. For example, according to the purpose, when some regions is required to have conductivity higher than the rest area or when perception of the touch is further sensitively required in some regions, the conductive patterns of the corresponding region and the rest regions may vary. In order to have at least a part of the conductive pattern different from the rest printing pattern, a line width and a line interval of the print pattern may vary. For example, in the case of a capacitive touch screen, whether a portion connected with a side pad has high conductivity has been a large issue.

According to an exemplary embodiment of the present invention, the conductor may comprise a region in which the conductive pattern is not formed.

According to an exemplary embodiment of the present invention, the conductive pattern may be blackened. When a paste comprising a metal material is fired at a high temperature, metallic luster is expressed, such that visibility may be deteriorated due to reflection of light. The problem may be prevented by blackening the conductive pattern. In order to blacken the conductive pattern, a blackening material is added into a paste for forming the conductive pattern or the paste is printed and fired, and then blackened to blacken the conductive pattern.

The blackening material added into the paste may be metal oxide, carbon black, carbon nano-tube, a black pigment, a colored glass frit, or the like. In this case, composition of the paste preferably comprises a conductive pattern material of 50 to 90 wt %, an organic binder of 1 to 20 wt %, a blackening material of 1 to 10 wt %, a glass frit of 0.1 to 10 wt %, and a solvent of 1 to 20 wt %.

When blackening after the firing, the composition of the paste may comprise a conductive pattern material of 50 to 90 wt %, an organic binder of 1 to 20 wt %, a glass frit of 0.1 to 10 wt %, and a solvent of 1 to 20 wt %. The blackening after firing is performed by immersing in an oxide solution, for example, Fe or Cu ion contained solution, immersing in a halogen ion contained solution such as chloride ion, immersing in hydrogen peroxide, nitrate, or the like, and processing by halogen gas.

In order to maximize an effect for preventing the moire phenomenon, the conductive pattern may be formed so that an area of a pattern having symmetric-structure figures is 10% or more for an overall area of the pattern. In addition, an area of the figures, in which at least one of lines which connect a center point of any one figure forming the Voronoi diagram with a center point of adjacent figure forming the border with the figure has a length different from the rest of the lines, may be 10% or more for an overall area of the conductive pattern. Further, a pattern area of the figures, in which at least one side forming a figure formed by at least one triangle forming the Delaunay pattern has a length different from the rest of the sides, may be 10% or more for an area of the overall conductive pattern.

Figure 40:
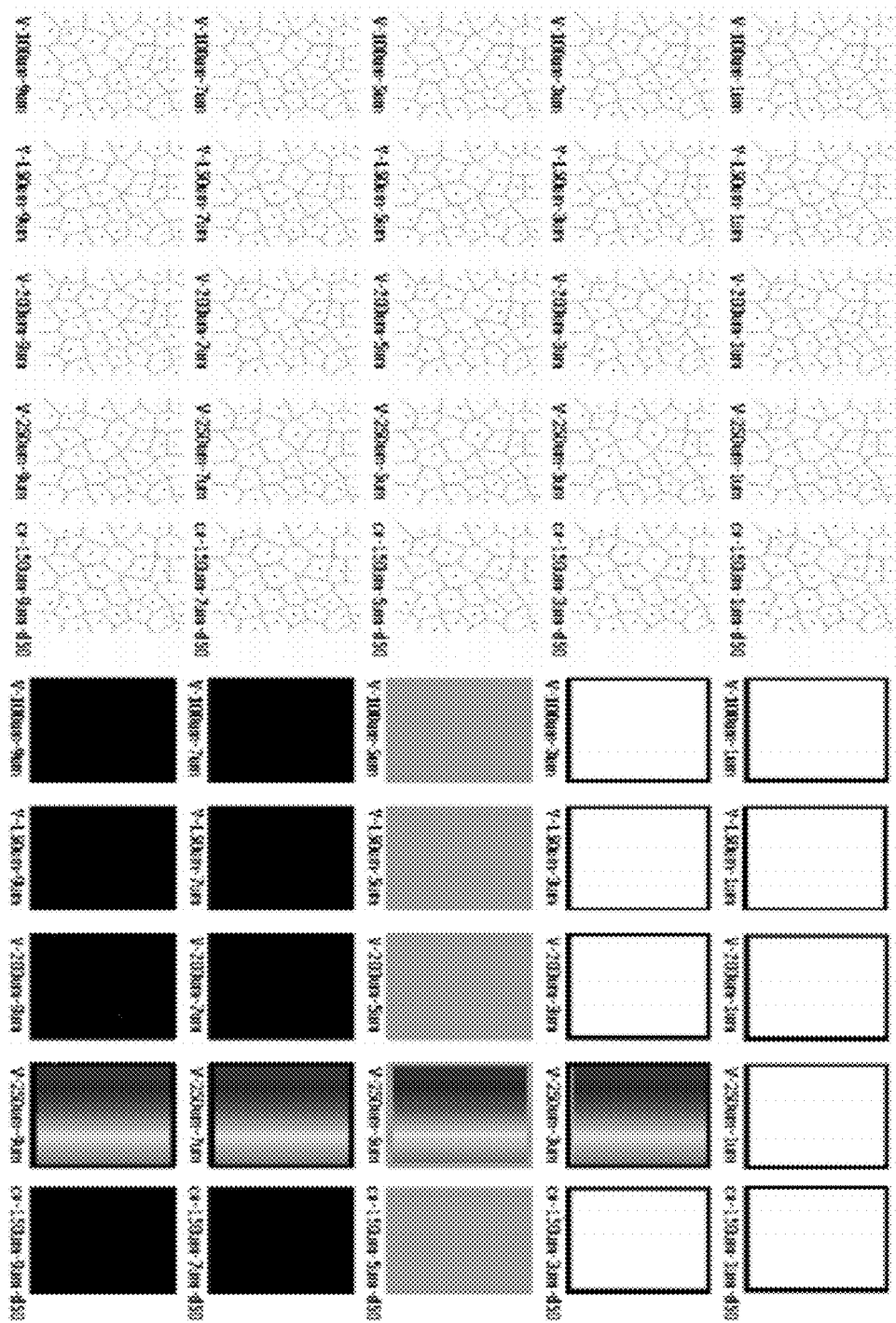
FIG. 40 is an exemplified diagram illustrating a moiré effect according to a line width and a pitch.

The moire phenomenon may be avoided by the pattern, but the evasion of the moire phenomenon may be maximized by controlling the line width and the pitch of the conductive pattern. In detail, the conductive pattern has a fine line width of 100 micrometers or less, preferably 0.1 to 30 micrometers, more preferably 0.5 to 10 micrometers, and further more preferably 1 to 5 micrometers, such as all the remaining moire phenomenon can also be prevented. In addition, since the pitch of the conductive wire pattern does not coincide with a size unit of a pixel of the display, for example, in the case of a display having a sub pixel of 250 micrometers in a longitudinal axial direction, a pitch interval of the conductive pattern of 250 pitches is prevented, such that color distortion of the display due to pixel interference can be prevented. The moire phenomenon according to a line width and a pitch was shown in FIG. 40. As a result of evaluating the moire according to variation in the line width and the pitch of 10 micrometers or less, in 1.3 micrometers, the remaining moire does not occur. Further, in 250 pitches, rainbow-color is observed. As a result, a correlation with a major axial length of a pixel in a display such as an LCD can be verified.

Herein, the present invention is exemplified by the following examples. However, the following examples are to exemplify the present invention and the scope of the present invention is not limited thereto.

EXAMPLES

Example 1

In order to manufacture a touch screen, a glass substrate in which an MoTi alloy with a thickness of 30 nm was deposited on glass of 0.5 t, Cu with a thickness of 200 nm was deposited thereon again, and Mo with a thickness of 30 nm was deposited thereon by using a sputtering process was manufactured.

Thereafter, etching resist ink (novolak resin composition (Product No. LG412DF made by LG CHEMISTRY, LTD. in KOREA)) was printed by using Cliché having a Voronoi irregular pattern having a size of 8 microns in line width and 200 microns in pitch through reverse offset printing. Thereafter, after a printed sample was baked at 130° C. for 3 minutes, the baked sample was etched (just etching time 30 sec) at 40° C. for approximately 110 seconds by using Cu etchant (ELCE-100) which is being prepared by ENF (Korea). Subsequently, the etching resist ink of the Voronoi pattern was removed.

Figure 41:
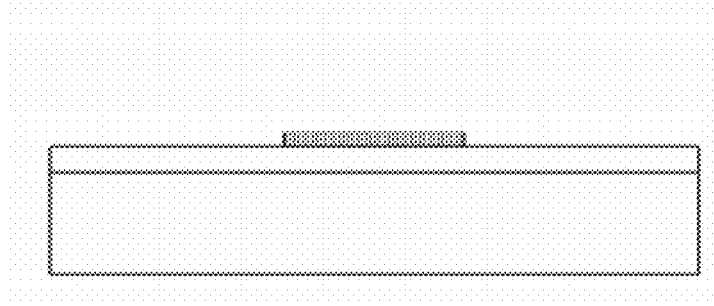
FIGS. 41 to 43 are diagrams illustrating a conductive pattern manufactured in Example 1.
Figure 42:
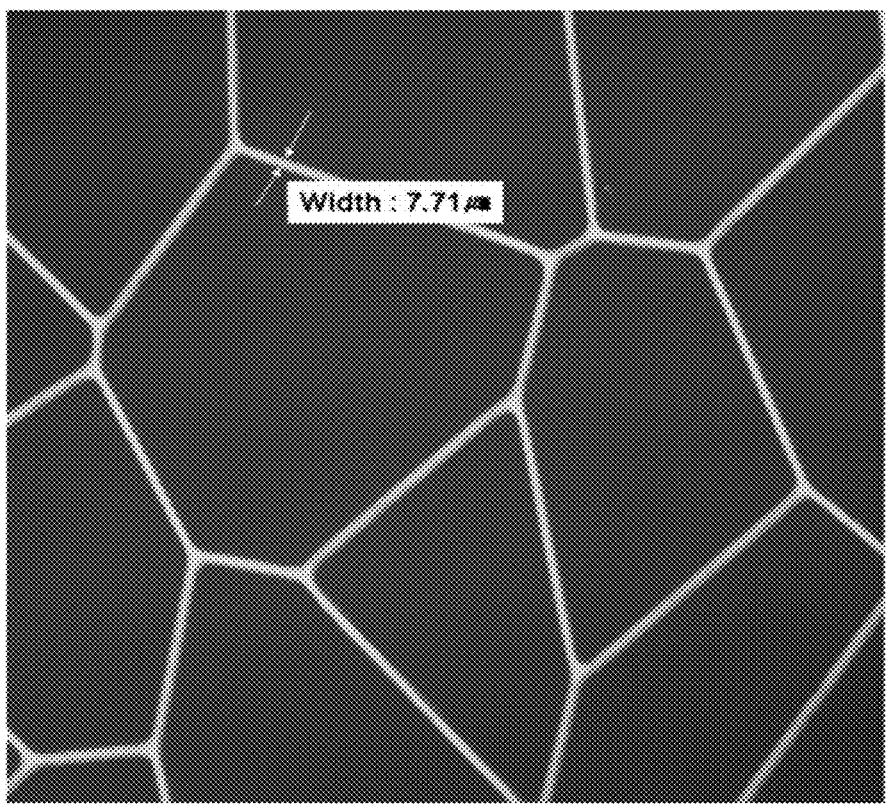
Figure 43:
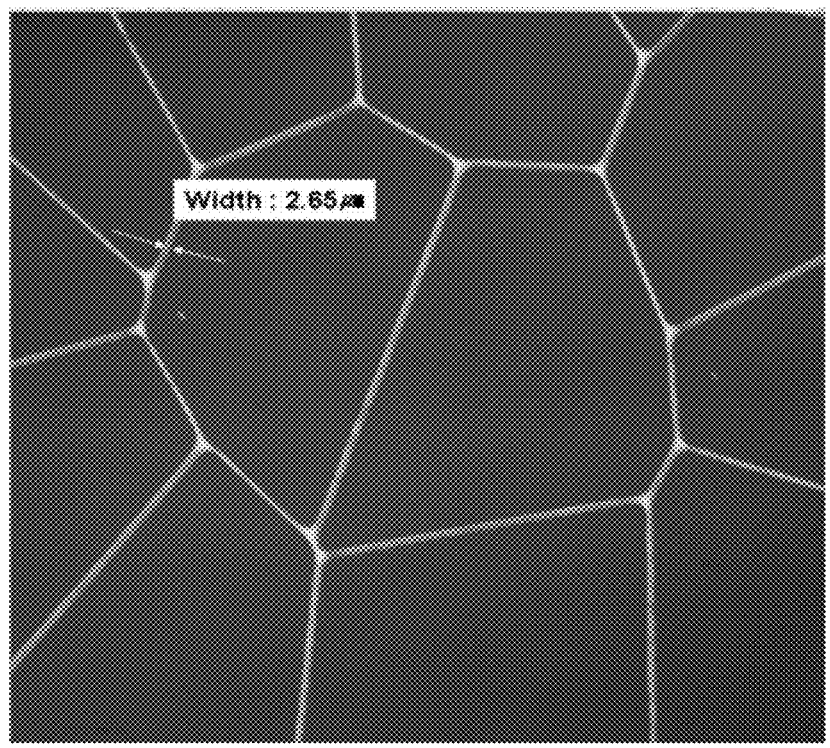

A conductive pattern manufactured thereby was shown in FIG. 41 and the line width of the conductive pattern was 2.65 micrometers. A photograph before removing the etching resist ink after the etching was shown in FIG. 42 and a photograph of the conductive pattern after removing the etching resist ink was shown in FIG. 43.

Thereafter, a PAD part of an electrode covered with etching resist of an insulating layer was partially removed using an LGS 100 stripper made by LG CHEMISTRY, LTD.

The process was repeatedly performed with respect to the same metal deposited on PET having a thickness of 150 microns and thereafter, an (acrylic resin based) adhesive film having a thickness of 100 adhered to the metal (in this case, an adhesive was removed from an ACF connection portion in attachment). Therefore, the touch screen was completed by attaching ACF.

Example 2

In order to manufacture a touch screen, a glass substrate in which an Ni metal with a thickness of 20 nm was deposited on glass of 0.5 t, Ag with a thickness of 200 nm was deposited thereon again, and Ni with a thickness of 20 nm was again deposited thereon by using the sputtering process was manufactured.

Thereafter, UV curable ink (LGP-7 made by NATOKO (Japan) was printed by using Cliché having the Voronoi irregular pattern having a size of 8 microns in line width and 200 microns in pitch through gravure offset printing.

Figure 44:
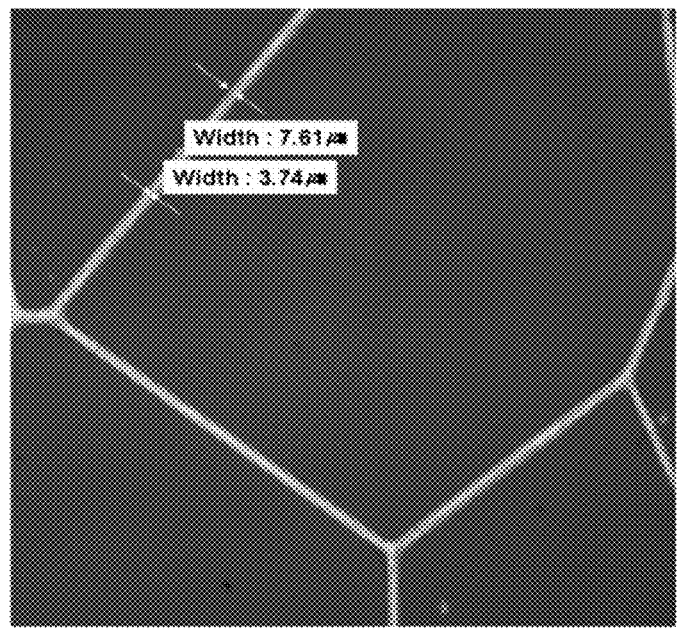
FIG. 44 is a diagram illustrating a conductive pattern manufactured in Example 2.

Thereafter, after a printed sample was exposed through UV curing of approximately 500 mJ/cm$^2$, the substrate was baked at 130° C. for 30 minutes. Subsequently, the baked substrate was etched (just etching time 20 sec) at 40° C. for approximately 60 seconds by using Al etchant (a mixed solution of phosphoric acid, nitric acid, acetic acid, and water) which is being prepared by ZEUS (Korea). A conductive pattern manufactured thereby was shown in FIG. 15. Since UV curable ink is transparent, an internal line width could be measured and the line width of the conductive pattern was 3.74 micrometers and the line width of an insulating layer pattern was 7.61 micrometers. A photograph of the conductive pattern was shown in FIG. 44.

Thereafter, the PAD part of the electrode covered with the etching resist of the insulating layer was partially removed by using a KOH 30% solution.

The process was repeatedly performed with respect to the same metal deposited on PET having a thickness of 150 microns and thereafter, the (acrylic resin based) adhesive film having a thickness of 100 adhered to the metal (in this case, the adhesive was removed from the ACF connection portion in attachment). Therefore, the touch screen was completed by attaching ACF.

The invention claimed is:
1. A touch screen, comprising: a substrate; a conductive pattern formed on at least one side of the substrate; and an insulating layer pattern covering the conductive pattern, wherein the touch screen is manufactured by the method comprising the steps of:

a) forming a conductive layer on a substrate;
b) forming an etching resist pattern on the conductive layer; and
c) forming a first conductive pattern having a line width smaller than the line width of the etching resist pattern by over-etching the conductive layer by using the etching resist pattern,
wherein in step c), an etching time of the conductive layer is just-etching time to a time more extended by 2,000% than the lust-etching time,
wherein the conductive pattern has a line width of 100 micrometer or less,
wherein the conductive pattern has a pattern shape formed continuously on an area of 7 inch or more,
wherein the insulating layer pattern has a line width larger than the line width of the conductive pattern, and
wherein in a cross-section of the line width direction of the conductive pattern, a percentage a/b*100 of a distance "a" from one end of the conductive pattern to the insulating layer pattern and a distance "b" from the other end of the conductive pattern to the insulating layer pattern is in the range of 90 to 110.

2. A touch screen, comprising:
a substrate;
a conductive pattern formed on at least one side of the substrate; and
an insulating layer pattern covering the conductive pattern,
wherein the insulating layer pattern has a taper angle of more than 0 degree to less than 90 degrees,
wherein the conductive pattern has a line width of 100 micrometer or less,
wherein the conductive pattern has a pattern shape formed continuously on an area of 7 inch or more,
wherein the insulating layer pattern has a line width larger than the line width of the conductive pattern, and
wherein in a cross-section of the line width direction of the conductive pattern, a percentage a/b*100 of a distance "a" from one end of the conductive pattern to the insulating layer pattern and a distance "b" from the other end of the conductive pattern to the insulating layer pattern is in the range of 90 to 110.

3. The touch screen of claim 2, wherein the insulating layer pattern has insulation with a leakage current of 0.1 ampere or less.

4. The touch screen of claim 2, wherein the insulating layer pattern comprises at least one selected from the group consisting of imide-based polymer, bisphenol-based polymer, epoxy-based polymer, acryl-based polymer, ester-based polymer, novolac-based polymer, and a combination thereof.

5. The touch screen of claim 2, wherein the insulating layer pattern comprises at least one selected from the group consisting of imide-based monomer, bisphenol-based monomer, epoxy-based monomer, acryl-based monomer, ester-based monomer, a combination thereof, and copolymer thereof.

6. A touch screen, comprising:
a substrate;
a conductive pattern formed on at least one side of the substrate; and
an insulating layer pattern covering the conductive pattern,
wherein a taper angle of the insulating layer pattern is larger than the taper angle of the conductive pattern,
wherein the conductive pattern has a line width of 100 micrometer or less,
wherein the conductive pattern has a pattern shape formed continuously on an area of 7 inch or more,
wherein the insulating layer pattern has a line width larger than the line width of the conductive pattern, and
wherein in a cross-section of the line width direction of the conductive pattern, a percentage a/b*100 of a distance "a" from one end of the conductive pattern to the insulating layer pattern and a distance "b" from the other end of the conductive pattern to the insulating layer pattern is in the range of 90 to 110.

7. A touch screen, comprising:
a substrate;
a conductive pattern formed on at least one side of the substrate; and
an insulating layer pattern covering the conductive pattern,
wherein a void is comprised between the conductive pattern and the insulating layer pattern,
wherein the conductive pattern has a line width of 100 micrometer or less,
wherein the conductive pattern has a pattern shape formed continuously on an area of 7 inch or more,
wherein the insulating layer pattern has a line width larger than the line width of the conductive pattern, and
wherein in a cross-section of the line width direction of the conductive pattern, a percentage a/b*100 of a distance "a" from one end of the conductive pattern to the insulating layer pattern and a distance "b" from the other end of the conductive pattern to the insulating layer pattern is in the range of 90 to 110.

8. A touch screen, comprising:
a substrate; and
a conductive pattern formed on at least one side of the substrate and having a line width of 100 micrometer or less,
wherein the touch screen further comprises an insulating layer pattern formed on the conductive pattern, and the insulating layer pattern covers the conductive pattern or has a line width larger than the line width of the conductive pattern,
wherein the conductive pattern has a pattern shape formed continuously on an area of 7 inch or more, and
wherein in a cross-section of the line width direction of the conductive pattern, a percentage a/b*100 of a distance "a" from one end of the conductive pattern to the insulating layer pattern and a distance "b" from the other end of the conductive pattern to the insulating layer pattern is in the range of 90 to 110.

9. The touch screen of claim 8, wherein the conductive pattern has a taper angle of more than 0 degree to less than 90 degrees.

10. The touch screen of claim 8, wherein the insulating layer pattern has a taper angle of more than 0 degree to less than 90 degrees.

11. The touch screen of claim 8, wherein a taper angle of the insulating layer pattern is larger than the taper angle of the conductive pattern.

12. The touch screen of claim 8, wherein a void is comprised between the conductive pattern and the insulating layer pattern.

13. The touch screen of claim 8, wherein the conductive pattern has a sheet resistance of 100 ohm/square to 0.001 ohm/square.

14. The touch screen of claim 8, wherein the conductive pattern has a thickness of 300 nm or less.

15. The touch screen of claim 8, wherein the conductive pattern has an aperture ratio of 85% to 98%, a sheet resistance of 1 ohm/square to 200 ohm/square, a thickness of 100 to 300 nm, and a line width of 0.1 to 10 micrometer and satisfies the following equation 1:

$$a/(1-\text{aperture ratio})=A \qquad \text{[Equation 1]}$$

in Equation 1, a is a sheet resistance in a thickness t of a layer made of a material constituting the conductive pattern and A is a sheet resistance in a thickness t of the conductive pattern.

16. The touch screen of claim 8, wherein the conductive pattern satisfies the following equations 2 and 3:

$$a/[1-(R-L)^2/R^2]=A \qquad \text{[Equation 2]}$$

$$(R-L)^2/R^2 \times Ts = Tc \qquad \text{[Equation 3]}$$

in Equations 2 and 3, R is a pitch of the conductive pattern, L is a line width of the conductive pattern, a is a sheet resistance in a thickness t of a layer made of a material constituting the conductive pattern, A is a sheet resistance in a thickness t of the conductive pattern, Ts is transmittance of the substrate in itself, and Tc is transmittance of the substrate having the conductive pattern.

17. The touch screen of claim 8, wherein the conductive pattern has a deviation of a thickness within 3% for each position.

18. The touch screen of claim 8, wherein the conductive pattern has a deviation of a line width within 30% for each position.

* * * * *